(12) United States Patent
Khan et al.

(10) Patent No.: US 6,802,933 B2
(45) Date of Patent: Oct. 12, 2004

(54) APPARATUS FOR PERFORMING SELF CLEANING METHOD OF FORMING DEEP TRENCHES IN SILICON SUBSTRATES

(76) Inventors: Anisul Khan, 1180 Lochinvar Ave, Apt #53, Sunnyvale, CA (US) 94087; Ajay Kumar, 510 Kenil Worth Ct., Sunnyvale, CA (US) 94087; Jeffrey D. Chinn, 605 St. Croix La., Forster City, CA (US) 94404; Dragan Podlesnik, 1736 Oak Creek Dr., Palo Alto, CA (US) 94304

( * ) Notice: Subject to any disclaimer, the term of this patent is extended or adjusted under 35 U.S.C. 154(b) by 397 days.

(21) Appl. No.: 09/740,146

(22) Filed: Dec. 18, 2000

(65) Prior Publication Data

US 2001/0020516 A1 Sep. 13, 2001

Related U.S. Application Data

(62) Division of application No. 09/405,349, filed on Sep. 24, 1999, now Pat. No. 6,318,384.

(51) Int. Cl.[7] .......................... C23F 1/00; H01L 21/306
(52) U.S. Cl. .................. 156/345.26; 156/345.33; 156/345.38; 156/345.48; 156/916; 118/723 I; 118/723 IR
(58) Field of Search ................ 156/345.26, 345.33, 156/345.38, 345.48, 916; 118/723 I, 723 IR

(56) References Cited

U.S. PATENT DOCUMENTS

| | | | |
|---|---|---|---|
| 4,376,672 A | 3/1983 | Wang et al. | 156/643 |
| 4,668,338 A | 5/1987 | Maydan et al. | 156/643 |
| 4,842,683 A | 6/1989 | Cheng et al. | 156/345 |
| 4,951,601 A | 8/1990 | Maydan et al. | 118/719 |
| 5,186,594 A | 2/1993 | Toshima et al. | 414/217 |
| 5,298,790 A | 3/1994 | Harmon et al. | 257/622 |
| 5,423,941 A | 6/1995 | Komura et al. | 156/643.1 |
| 5,431,772 A | 7/1995 | Babie et al. | 156/643.1 |
| 5,585,012 A | 12/1996 | Wu et al. | 216/71 |
| 5,756,400 A | 5/1998 | Ye et al. | 438/710 |
| 5,814,563 A | 9/1998 | Ding et al. | 438/714 |
| 6,136,211 A * | 10/2000 | Qian et al. | 216/37 |
| 6,440,866 B1 * | 8/2002 | Collins et al. | 438/714 |
| 6,454,898 B1 * | 9/2002 | Collins et al. | 156/345 |

FOREIGN PATENT DOCUMENTS

| | | |
|---|---|---|
| EP | 0 854 510 | 7/1998 |
| JP | 8017804 | 1/1996 |
| WO | WO 99/20812 | 4/1999 |
| WO | WO 99/25015 | 5/1999 |

* cited by examiner

Primary Examiner—George A. Goudreau
(74) Attorney, Agent, or Firm—Shirley L. Church; Joseph Bach; Walter Benjamin Glenn

(57) ABSTRACT

This invention is directed to a method for etching films on semiconductor substrates and cleaning etch chambers. The method includes an improved processing sequence and cleaning method where residue formed from processing a previous substrate are cleaned by the etching process used to remove an exposed layer of material from the present substrate. The process provides improved substrate throughput by combining the step to clean residue from a previous substrate with an etch step conducted on the present substrate. Applicants have found the method particularly useful in processing structures such as DRAM stacks, especially where the residue is formed by a trench etched in the previous silicon substrate and the exposed layer etched from the present substrate is silicon nitride.

18 Claims, 11 Drawing Sheets

US 6,802,933 B2

APPARATUS FOR PERFORMING SELF CLEANING METHOD OF FORMING DEEP TRENCHES IN SILICON SUBSTRATES

This application is a divisional application of Application Ser. No. 09/405,349, filed Sep. 24, 1999, now U.S. Pat. No. 6,318,884.

BACKGROUND OF THE INVENTION

1. Field of the Invention

The present invention pertains to etching trenches in silicon substrates and cleaning processes to remove deposits from reactors used in etching processes. The method of the invention is generally applicable to the-etching of silicon, but is particularly useful in the etching of deep trenches. Silicon deep trench etching is most commonly used in capacitor technology, in particular, in DRAM applications. Other applications for the present etching method include the etching of shallow trenches used in applications such as device isolation; the etching of polysilicon gates; and the etching of silicide layers. In addition, the present etching method is useful in process sequences utilized in the micro machining of silicon surfaces for biomedical applications, for example.

2. Description of the Related Art

Although the silicon etching method of the present invention is useful in a number of applications, as mentioned above, one of the most important applications is the etching of high aspect ratio (over about 20:1) trench capacitors used in DRAM applications. The profile of the etched trench must meet strictly defined industry standards. The current specification for a 256 Mb DRAM capacitor having a critical diameter ranging from about 0.15 to about 0.38 $\mu$m calls for strict profile taper control.

The development of manufacturing technology for fabrication of the trench structure 103 shown in FIG. 1C (and for silicon trench structures of the future) depends on development of a plasma etch technology which provides adequate selectivity for the silicon substrate over the patterning layer 108, the masking layer 106, and the dielectric layer 104, while providing an economically feasible etch rate for the silicon substrate layer 102, and enabling the necessary profile control as the dimensions of trench 103 are reduced. Additionally, as new profile control processes are developed, production worthy chamber cleaning methods and chemistries must also be developed to ensure economically feasible substrate throughput.

The typical approach to forming deep trenches in a representative DRAM stack (e.g., the DRAM stack 100 illustrated in FIG. 1A) is conducted in a linear fashion, first etch a via through the stack 100 to the substrate surface 105 or a substrate open step, then etch the trench 103. This division of the trench process led to process sequences intended to optimize processing in each of these two divisions—substrate open and trench etch.

FIG. 1A illustrates a portion of a representative structure 100 useful in capacitor fabrication. Structure 100 includes a silicon substrate 102, a dielectric pad oxide layer 104, a masking layer or hard mask 106, and a patterning layer 108. Typically the dielectric pad oxide layer is silicon dioxide, the masking layer is silicon nitride, and the patterning layer material is borosilicate glass (BSG) or a silicon oxide deposited using tetraethyl orthosilicate (TEOS), or a combination thereof. In some applications, a dielectric Anti-Reflective Compound (ARC) layer such as siliconoxynitride may be used in combination with the patterning layer.

Generally, trench formation production processes are accomplished by having a chamber dedicated to the substrate open process and another chamber dedicated to the trench etch process. The number of chambers used for each process depends upon throughput considerations such as the relative duration of the etch processing cycles and cleaning cycles as well as the specific dimension of the trench being formed and the thickness of the individual layers of structure 100.

A representative deep trench etch process will be described in relation to a structure 100 where the thickness of the borosilicate glass patterning mask 108 is about 7,000 Å; the thickness of silicon nitride masking layer 106 is about 2,200 Å; the thickness of pad oxide dielectric layer 104 is about 80 Å. FIGS. 1A, 1B and 1C are not to scale. FIG. 1A illustrates a substrate having stack 100 as it is loaded into the first processing chamber.

In the first processing chamber, which may be for example, a Magnetically Enhanced Reactive Ion Etch (MERIE) Chamber, or other processing chamber suitable for conducting the substrate open process. Reactive gases are introduced and a plasma is formed to expose the substrate 102 top surface 105 by removing patterning layer 108, masking layer 106 and pad oxide layer 104. The mask is typically opened by plasma etch using $CHF_3$ and $O_2$ based chemistry. Typical etch rates for this type of process are about 1 $\mu$m/minute. Periodic dry cleaning is conducted after processing about 100 wafers. In this example, about 9280 Å of material is removed during the substrate open process.

During the etching processes, etchant residue (often referred to as a polymer) deposits on the walls and other component surfaces inside the etching chamber. The composition of the etchant residue depends upon the chemical composition of vaporized species of etchant gas, the material being etched, and the mask layer on the substrate. The vaporized and gaseous species condense to form etchant residue comprising polymeric byproducts composed of hydrocarbon species from the resist; gaseous elements such as fluorine, chlorine, oxygen, or nitrogen; and elemental silicon or metal species depending on the composition of the material being etched. The polymeric byproducts deposit as thin layers of etchant residue on the walls and components in the chamber. The composition of the etchant residue typically varies considerably across the chamber surface depending upon the composition of the localized gaseous environment, the location of gas inlet and exhaust ports, and the geometry of the chamber. The compositionally variant, non-homogeneous, etchant residue formed on the etching chamber surfaces has to be periodically cleaned to prevent contamination of the substrate.

Typically, after processing the substrate open process on about 100 wafers, an in-situ plasma "dry-clean" process is performed in an empty etching chamber to clean the chamber. Periodically, the chamber is taken out of service to conduct a wet clean to more completely remove processing residue.

After conducting the substrate open process, the substrate is transferred into the second processing chamber to conduct the trench etch process. The second processing chamber may be any processing chamber suitable for etching deep trenches in substrates such as, for example, a Decoupled Plasma Etch Reactor as manufactured by Applied Materials, Inc. of Santa Clara Calif. During the trench etch process, a mixture of processes gases is introduced into the chamber and formed into a plasma which is used to remove substrate material to form the trench. A typical deep trench structure 103 is illustrated in FIG. 1C. The top portion 110 of the trench 103, which extends from the silicon surface 105 into the silicon substrate 102 a depth 114 of about 1.5 μm is specified to taper at an angle of 88.5°+/−0.5°. The bottom portion 112 of the trench 103, which extends beneath the top portion 110 for an additional depth 116 of about 6.5 μm is specified to taper at an angle of 89.5°+/−0.5°. The bottom of the trench is illustrated as rounded but may be bottle shaped rather than tapered.

Related U.S. patent application Ser. No. 09/102,527, filed Jun. 22, 1998, assigned to the assignee of the present invention, describes a method for etching high aspect ratio trenches in silicon where at least a portion of the silicon trench, particularly toward the bottom of the trench, is etched using a combination of reactive gases including fluorine-containing compound which does not contain silicon (FC); a silicon-containing compound (SC), which preferably also contains fluorine; and oxygen ($O_2$). The use of a fluorine-containing silicon compound is preferred as a means of improving the etch rate and removing debris from the etched surfaces, while providing supplemental silicon availability for protection (passivation) of the etched mask sidewall and the upper etched portion of the trench, during etching of the bottom portion of the trench. The non-fluorine-containing source of silicon is preferred when the desired trench profile requires additional protection of the etched mask sidewall and the etched surface at the top of the trench during etching the bottom portion of the trench.

The trench etch process may take as long as ten minutes to complete. While the combined fluorine containing gas, silicon containing gas, and oxygen plasma provides superior profile control for deep trenches, the process creates deposits within the processing reactor. The degree of deposit accumulation is such that the reactor typically requires cleaning after each substrate is processed. This cleaning process is conducted with a dummy substrate in the chamber and requires about 120 seconds to complete. As a result, the typical cycle time to etch a trench in a substrate is about one minute for substrate open process; about 10 minutes for trench formation, and about 2 minutes to clean the chamber after the trench etch.

Deposit accumulation during the trench etch process may be reduced by the introduction of cleaning gas into the plasma mixture (i.e. a self clean chemistry) or, as disclosed in U.S. patent application Ser. No. 09/102,527, $SiF_4$ may be turned off during the last 90 seconds of the trench process. However, these methods of deposit reduction may have adverse impacts on the trench process. The addition of self-clean chemistry, while reducing accumulations, increases the number of process gases required to control and introduces complexities in the interactions between the various trench etch gases and the self-clean gases. Turning off $SiF_4$ during the last 90 seconds of the trench etch may also negatively impact the hard mask layer since the $SiF_4$ reduces lateral erosion. As decreased device size leads to deeper trenches, the longer trench etch times needed for these deeper trenches increases the risk of lateral erosion. Thus, the reduced silicon gas species supplied to the chamber reduces accumulations at the possible expense of lateral mask erosion.

Thus, what is needed is a method of etching trenches in silicon substrates, particularly in the formation of deep trenches, that overcomes the shortcoming of the prior art and provides increased throughput.

BRIEF SUMMARY OF THE INVENTION

The present invention provides a method of etching a substrate in an etching chamber and cleaning off residues formed in the chamber. In one aspect, the present invention provides a method of etching films comprising loading a substrate having an exposed layer into an etch reactor having deposits formed therein during an etch process conducted on another substrate; conducting another etch process on the loaded substrate that removes said exposed layer and said deposits; and conducting said an etch process on the loaded substrate.

These and other features, aspects, and advantages of the present invention will be better understood from the following drawings, description and appended claims, which illustrate examples of the invention.

BRIEF DESCRIPTION OF THE SEVERAL VIEWS OF THE DRAWINGS

While the description and drawings below illustrate exemplary features of the invention, it is to be understood that each of the features can be used in the invention in general, not merely in the context of the particular drawings, and the invention includes any combination of these features.

DETAILED DESCRIPTION OF THE INVENTION

I. Single Chamber Embodiment of the Present Invention

The method of the present invention can be implemented on a processing system having a single processing chamber. While any of a variety of processing chambers may enjoy the advantages of the present invention, the method will be described as implemented on a computer controlled HDP etching chamber 200 as illustrated and described below in FIG. 2. The present invention provides a method to etch a layer or one of a plurality the layers formed on a substrate while simultaneously removing deposits formed within the chamber from a previously processed substrate. In an embodiment of the present invention, the layer to be etched is compatible with the deposits formed within the chamber. Advantageously, processing efficiencies are realized since a single step is utilized to process a substrate while cleaning the deposits produced by processing the previous substrate. In this way, etching a layer on one substrate is combined with cleaning the residue formed from etching a previous substrate.

Figure 7:
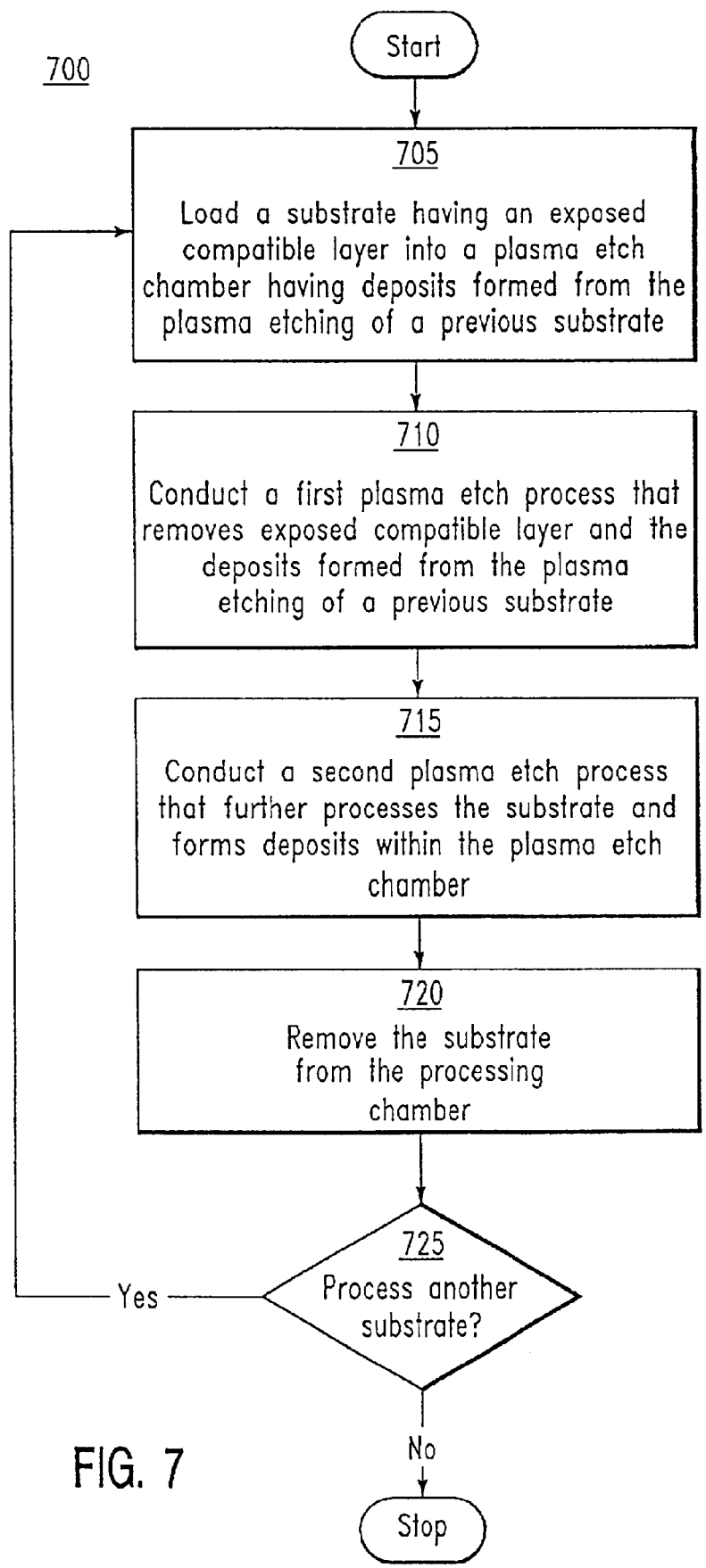
FIG. 7 is a flowchart of a single chamber method of forming silicon trenches according to the present invention.

Additionally, rather than risk interference with trench profile control by incorporating self-cleaning gas chemistry, the present invention compensates for residue forming critical step processing steps (i.e., the etch process used to form the bottom of a deep, high aspect ratio trench) by allowing residue formation during the critical processing step. The method of the present invention combines the removal of the residue formed from the critical processing step (i.e. etching a trench) with the removal of a layer having less critical dimensions or less strict processing requirements compared to the small critical dimensions of high aspect ratio deep trenches. Additional details of an embodiment of the present invention are provided below and are illustrated in FIG. 7.

The method of the present invention has at least two advantages over the prior art processing methods described above. One advantage is increased throughput. Combining the residue removal step with the processing of a compatible layer removes the dedicated cleaning step normally conducted after residue forming processes. In some cases, the dedicated cleaning step can be substantial. For example, each substrate processed according to the plasma etch trench method described in co-pending application entitled "Silicon Trench Etching Using Silicon-Containing Precursors to Reduce or Avoid Mask Erosion" forms residues about 300 Å thick. These residue formations can require up to 120 seconds to clean using conventional single wafer cleaning techniques. In contrast to the prior art, the method of the present invention advantageously combines an etch process to remove a layer on a present substrate with a cleaning process to remove the residue formed from etching another, previous substrate.

Another advantage of the method of the present invention is increased process is chemistry options. Trench etch processes incorporating the method of the present invention are not complicated by incorporating a self-cleaning gas composition nor limited to those process gases having only low or no residue forming characteristics. To varying degrees, self cleaning gases adversely impact profile control particularly in high residue forming processes where increasing amounts of self-clean gases are added to offset the additional residue formation. Residue forming process chemistry is less of a concern since the method of the present invention combines the residue removal task with the etch process performed on the present substrate. More processing options are available because a process chemistry that previously was not considered or was considered less favorably because of excessive residue formation, may now be utilized. As smaller device geometry leads towards deeper trenches and smaller critical dimensions, increased processing options are needed that allow process engineers to focus exclusively on profile control. The method of the present invention provides enhanced profile control without regard for residue formation because process chemistry is selected and optimized based on profile control performance rather than a potential compromise between residue reduction and profile control.

Those of ordinary skill will appreciate that the method of the present invention may be practiced whenever a deposit removal process and compatible layer removal process are conducted simultaneously. For illustration, the present invention will be described with regard to the formation of deep trenches in the silicon substrate as used in the formation of 256 Mb DRAM capacitors. FIGS. 6A, 6B, 6C and 6D illustrate a representative structure 900 formed on a substrate 203 on which an embodiment of method of the present is conducted.

Figure 6A:
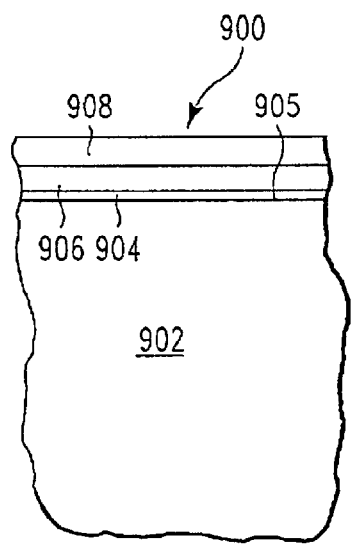
FIG. 6a is a schematic cross-section of a substrate having pad oxide layer, a hard mask layer and a pattern layer.

Structure 900 of FIGS. 6A–6D is similar to structure 100 of FIGS. 1A–1D. Structure 900 will be referred to in relation to the steps provided in flowchart 700. The substrate 902 comprises, for example, a semiconductor material, such as a silicon or gallium arsenide wafer, with a plurality of layers formed thereon. The plurality of layers could be, for example, a representative DRAM structure 900 as illustrated in FIG. 6A. The DRAM structure 900 illustrated in FIG. 6A includes a silicon substrate 902 with a dielectric pad oxide layer 904, a masking layer 906 and a patterning layer 908. Typically the pad oxide layer 904 is about 80 Å thick and formed from silicon dioxide, the masking layer 906 is about 2,200 Å thick and formed from silicon nitride and the patterning layer 908 is about 7,700 Å thick and is formed from borosilicate glass (BSG) or other silicon oxide deposited, for example, using tetraethyl orthosilicate (TEOS) or other suitable silicon source.

Turning now to flow diagram 700 of FIG. 7, the first step 705 is to load a substrate having a portion of a compatible layer exposed into a plasma etch chamber having deposits formed from the plasma etching of a previous substrate. Deposits in this case are the deposits that are formed from a trench etch process used to form a trench 903 such as, for example, the deep trench method taught in commonly assigned U.S. patent application Ser. No. 09/102,527 filed Jun. 22, 1998 entitled "Silicon Trench Etching Using Silicon-Containing Precursors to Reduce or Avoid Mask Erosion," which is incorporated herein by reference.

U.S. patent application entitled "Silicon Trench Etching Using Silicon-Containing Precursors to Reduce or Avoid Mask Erosion" describes a method for etching high aspect ratio trenches in silicon where at least a portion of the silicon trench, particularly toward the bottom of the trench, is etched using a combination of reactive gases including fluorine-containing compound which does not contain silicon (FC); a silicon-containing compound (SC), which preferably also contains fluorine; and oxygen ($O_2$). When the SC is a fluorine-containing silicon compound, the volumetric ratio of the FC to SC ranges from about 25:1 to about 1:10, and the volumetric ratio of the $O_2$ to SC ranges from about 10:1 to about 1:10. When the SC is a non-fluorine-containing silicon compound, the volumetric ratio of the FC to SC ranges from about 100:1 to about 1:10, with the volumetric ratio of the $O_2$ to SC ranges from about 10:1 to about 1:10; and, preferably the volumetric ratio of the FC to SC ranges from about 38:1 to about 1:7.

The FC compound may be selected, for example, from the following: $F_2O$, $F_2O_2$, $NF_3$, $NOF$, $NO_2F$, $SF_6$, $SF_4$, $S_2F_2$, $S_2F_{10}$, $CF_4$, $CH_2F_2$, $CHF_3$, and $CH_3F$. The most preferred FC is $SF_6$. When the SC contains fluorine, the SC may be selected, for example, from the following: $SiF_4$, $Si_2F_6$, $SiHF_3$, $SiH_2F_2$, $SiH_3F$, $Si_2OF_6$, $SiCl_2F_2$, and $SiClF_3$. The most preferred fluorine-containing SC is $SiF_4$. When the SC does not contain fluorine, the SC may be selected from silicon-containing compounds such as $SiBr_4$, $SiHBr_3$, $SiH_2Br_2$, $SiH_3Br$, $SiCl_4$, $SiHCl_3$, $SiH_2Cl_2$, $SiH_3Cl$, $Si_2Cl_6$, $SiH_4$, $Si_2H_6$, $Si_3H_8$, $Si_4H_{10}$, $SiHI_2$, $SiH_2I$, $C_4H_{12}Si$, and $Si(C_2H_3O_2)_4$, by way of example, and not by way of limitation. The use of a fluorine-containing silicon compound is preferred as a means of improving the etch rate and removing debris from the etched surfaces, while providing supplemental silicon availability for protection (passivation) of the etched mask sidewall and the upper etched portion of the trench, during etching of the bottom portion of the trench. The non-fluorine-containing source of silicon is preferred when the desired trench profile requires additional protection of the etched mask sidewall and the etched surface at the top of the trench during etching the bottom portion of the trench.

In this example where the method of the present invention is applied to a trench etch sequence and the above described trench etch method is used to etch the bottom of the trench 912 on the previous substrate, it is primarily the deposits from the trench etch conducted on the previous substrate which are present in the chamber when another substrate is loaded in accordance with step 705. Other deposits may also be present such as deposits formed during etching the top portion of trench 903 and the etch to remove the pad oxide layer 904. Thus, the exposed compatible layer is that layer which can be etched while also removing the deposits formed from the previous substrate.

Figure 1A:
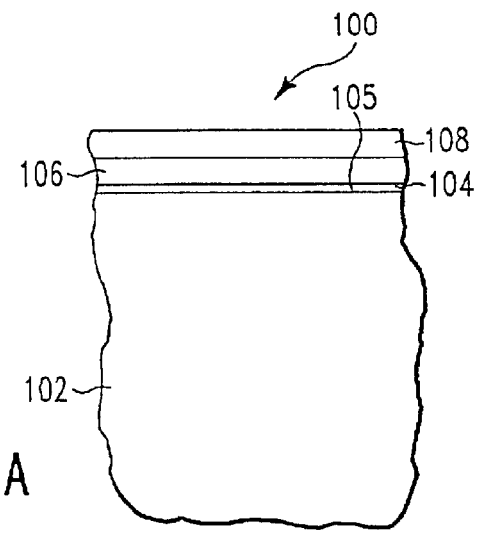
FIG. 1a is a schematic cross-section of a substrate having pad oxide layer, a hard mask layer and a pattern layer.
Figure 1B:
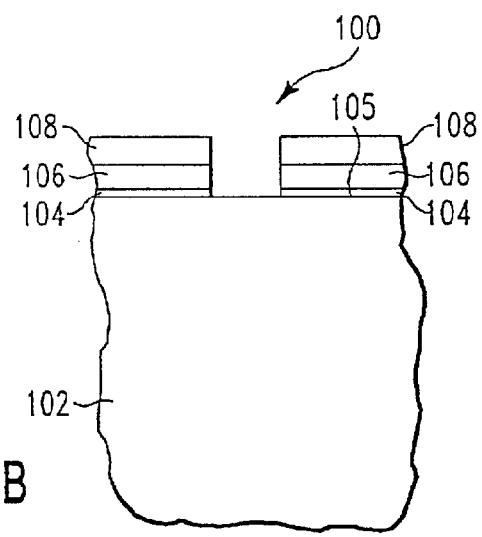
FIG. 1b is a schematic cross-section of the substrate of FIG. 1a after performing a substrate open etch to remove a portion of the patterning, mask and pad oxide layers.
Figure 1C:
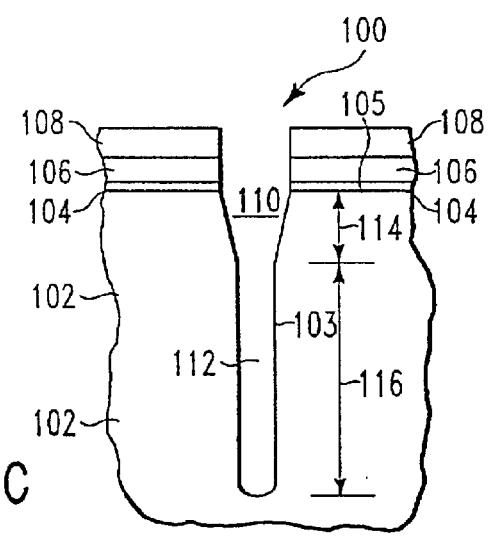
FIG. 1c is a schematic cross-section of the substrate of FIG. 1 after conducting a trench etch process to form a trench in the substrate.
Figure 2A:
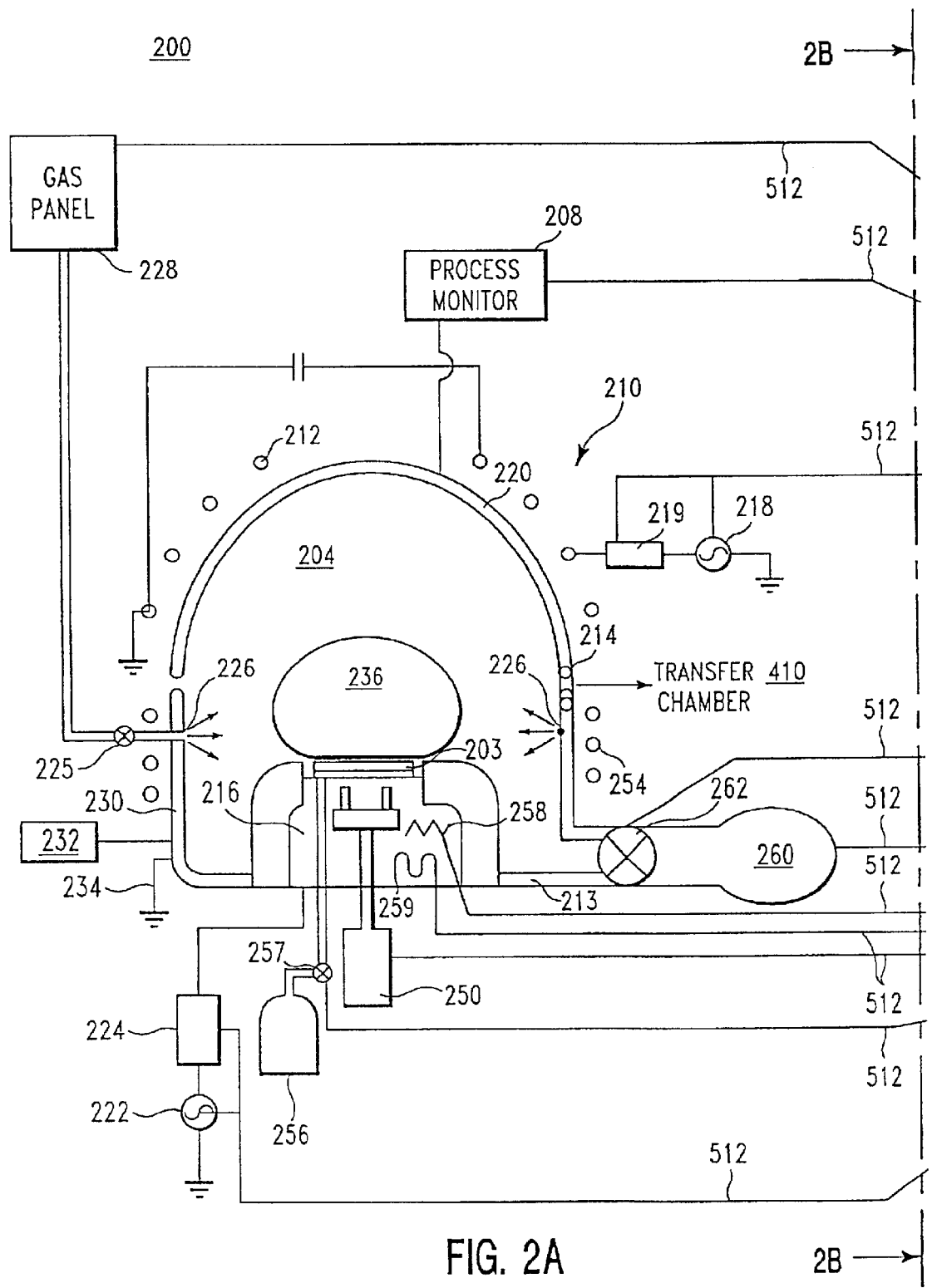
FIG. 2 is a sectional schematic side view of a computer controlled high density plasma etching apparatus.
Figure 2B:
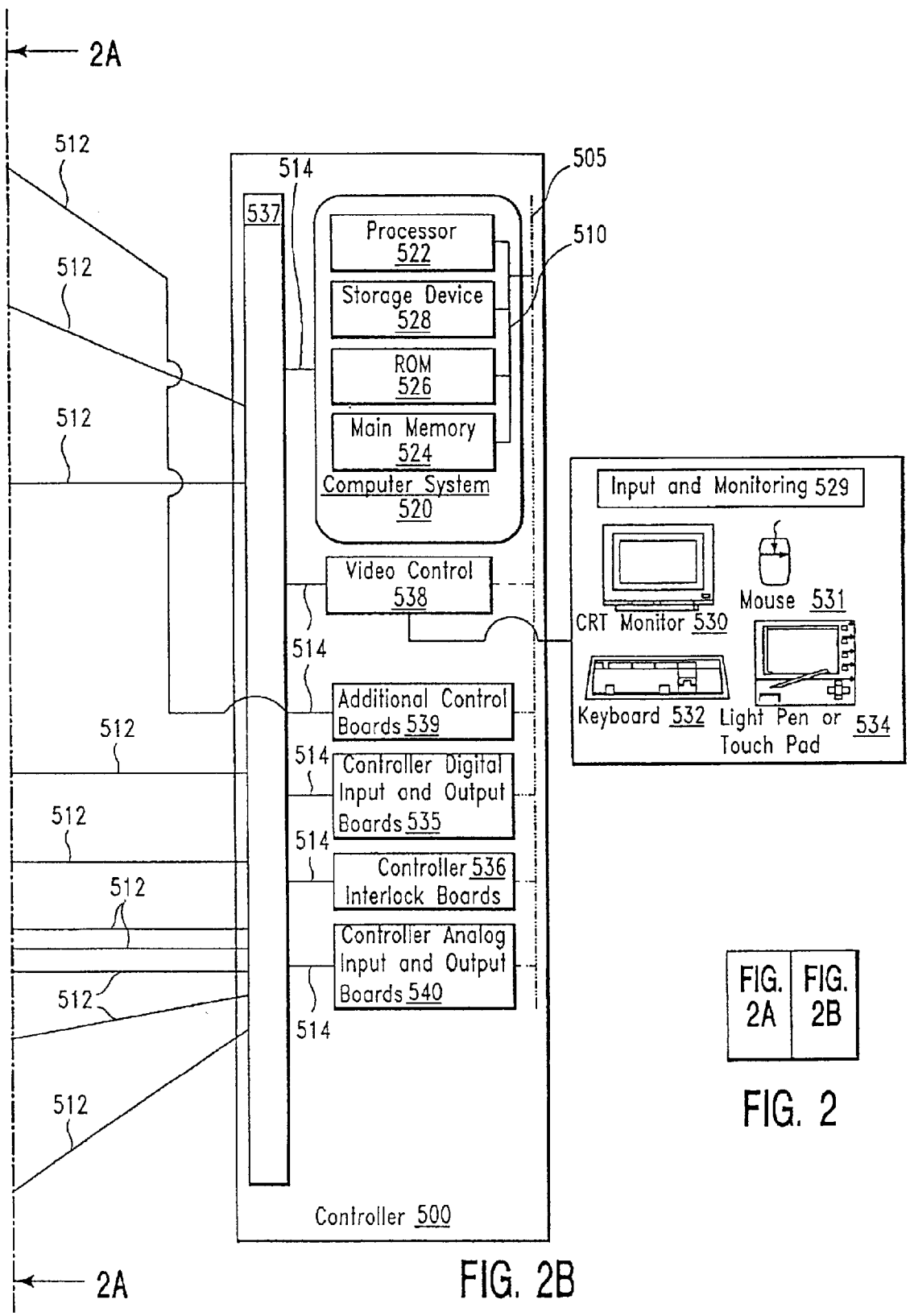
Figure 3A:
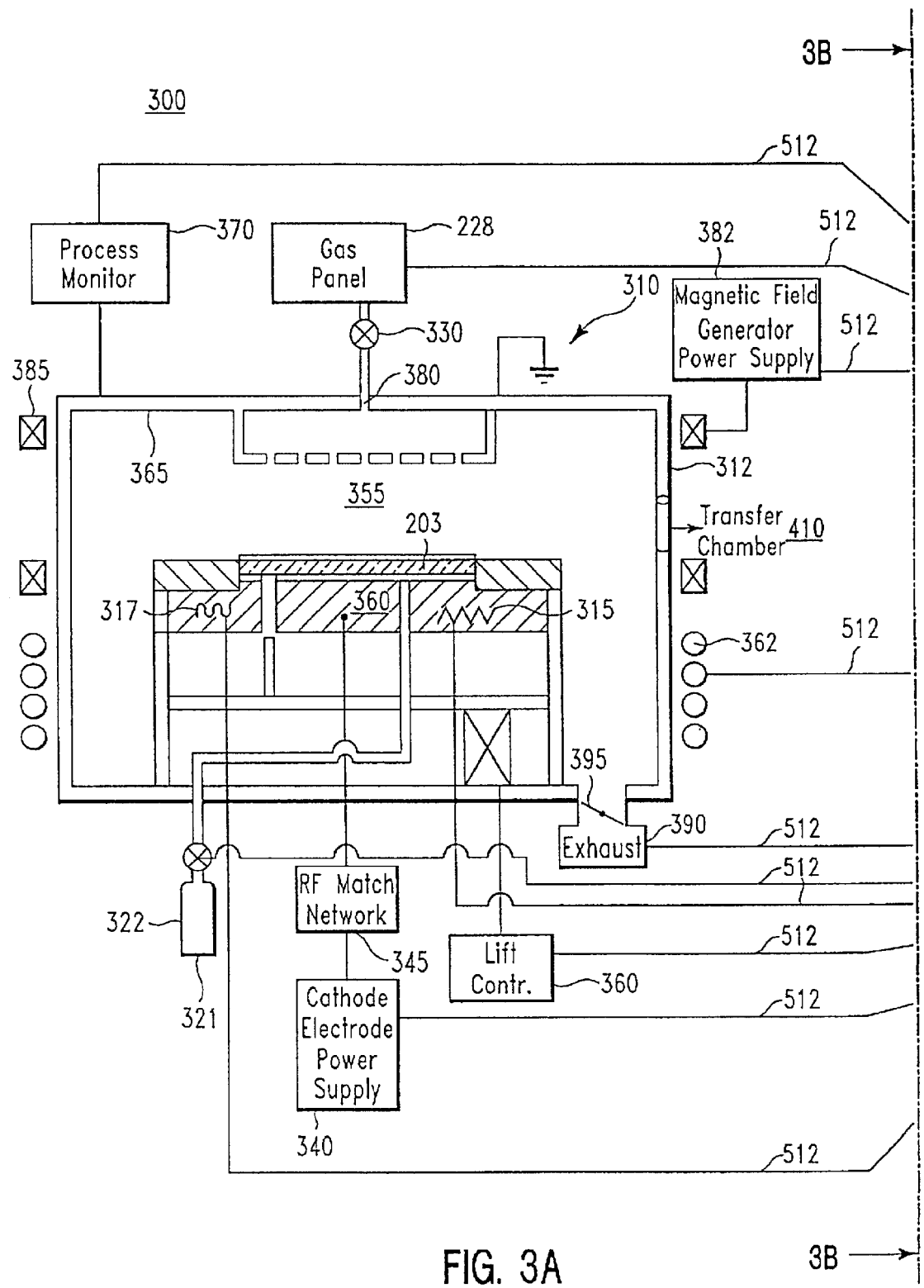
FIG. 3 is a sectional schematic side view of a computer controlled magnetically enhanced reactive ion etching apparatus.
Figure 3B:
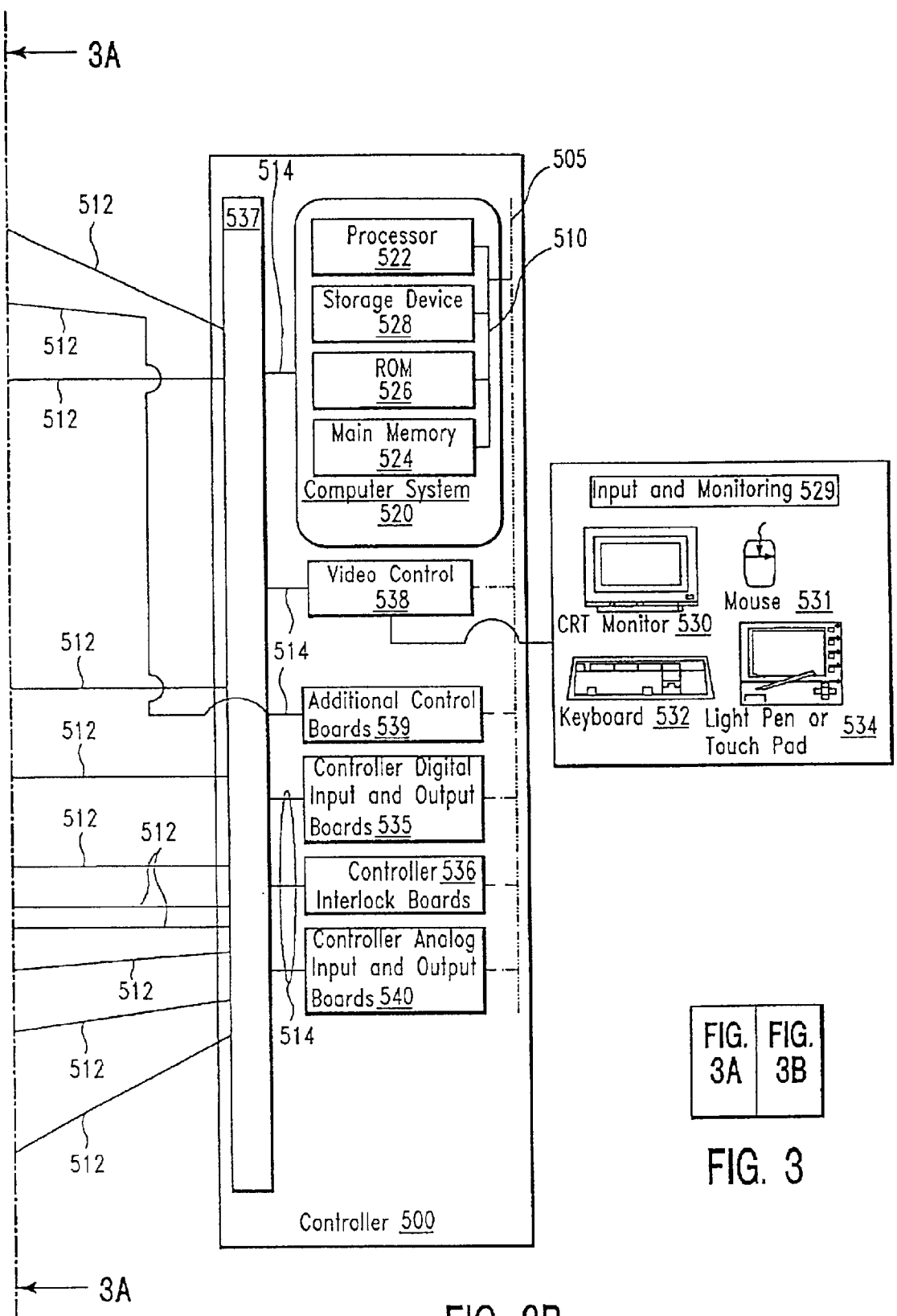
Figure 6B:
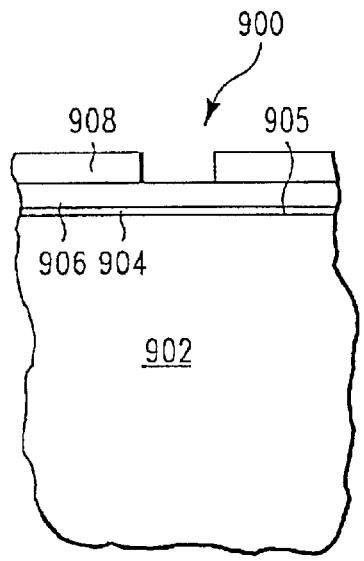
FIG. 6b is a schematic cross-section of the substrate of FIG. 6a having an exposed compatible layer.
Figure 6C:
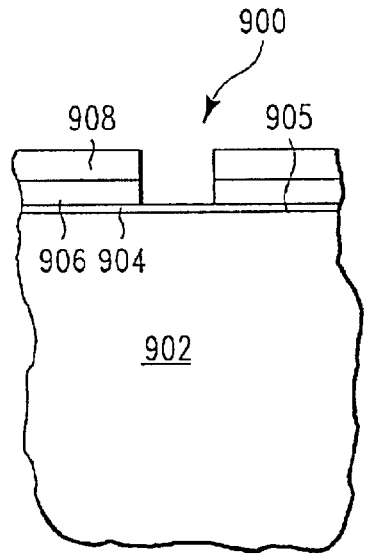
FIG. 6c is a schematic cross-section of the substrate of FIG. 6a after performing an etch process according to the present invention to remove an exposed compatible layer and deposits formed during processes conducted on a previous substrate.
Figure 6D:
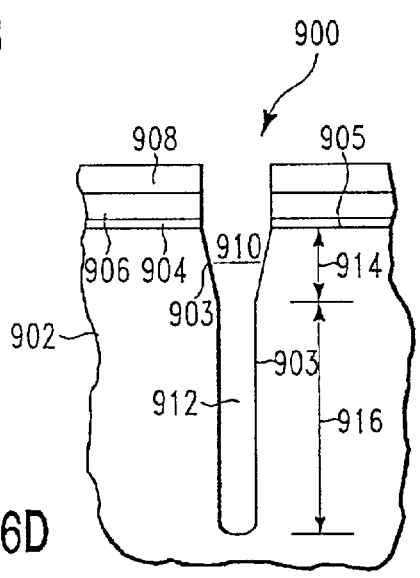
FIG. 6d is a schematic cross-section of the substrate of FIG. 6a after further processing the substrate and forming deposits within the chamber according to the method of the present invention.

Using the illustrations of FIGS. 6A–6D, for example, the deposits were formed by plasma etching trench 903 into a previous substrate as shown in FIG. 6D. Without removing those deposits, another substrate is loaded into a chamber, for example, a HDP plasma etch chamber as shown in FIG. 2 or a Magnetically Enhanced Reactive Ion Etch chamber as shown in FIG. 3 both of which are described in more detail below, having an exposed compatible layer configuration similar to FIG. 6B. The exposed layer of material on the substrate has been selected to be compatible with the deposits formed from the previous substrate's etch process. For example, Applicants have determined that a masking layer 906 formed from silicon nitride is a compatible layer with the deposits formed from conducting a trench etch on the previous substrate.

Next, as set forth in step 710, conduct a first plasma etch process that removes a portion of the exposed compatible layer and the deposits formed from the previously processed substrate. This step improves processing efficiency because a single step further processes the present wafer (i.e. removes a portion of the compatible layer) and cleans the chamber (i.e. removes the deposits from the etch process conducted on the previous substrate). Advantageously, using the method of the present invention, therefore, removes the dedicated clean step which may have been required in the prior art etch processes after conducting a trench etch.

The gas composition of the first plasma etching operation includes a gas mixture capable of removing both the compatible layer and the residue. While a single gas may be used, a typical process gas mixture for the first plasma etch operation includes an etchant gas for etching the compatible layer of the substrate and a cleaning gas for removing the residue from the previous substrate processing. Suitable etchant gases for etching the compatible layer will vary depending on the type of compatible layer presented. Suitable cleaning gases will vary depending upon the type of residue formed. Applicants have found that for the silicon trench residue, silicon nitride layer combination of the representative DRAM structure 900, one suitable gas combination for the first plasma etching operation includes a fluorine containing compound and a bromine containing compound. Suitable sources for the bromine containing compound include, but are not limited to: HBr, $Br_2$, $CFBr_3$. Suitable sources for a fluorine containing compound include, but are not limited to: $SF_6$, F, $NF_3$, HF, $CF_3$, $CF_4$, $CH_3F$, $CHF_3$, $C_2H_2F_2$, $C_2H_4F_6$, $C_2F_6$, $C_3F_8$, $C_4F_8$, $C_2HF_5$, $C_4F_{10}$, $CF_2Cl_2$, and $CFCl_3$. In a specific embodiment, the fluorine containing compound is $SF_6$ and the bromine containing compound is HBr.

Referring to the processing chamber of FIG. 2, a process gas mixture comprising etchant gas for etching the compatible layer of the substrate and a cleaning gas for removing the residue from the previous substrate processing is introduced into the chamber 200 through the gas outlet 226. The chamber is typically maintained at a pressure ranging from about 0.1 to about 400 mTorr. In the case where the compatible layer is formed from silicon nitride the preferred etchant gas is HBr. Suitable cleaning gases for removing the residue from the process chamber include, for example, $NF_3$, $CF_4$, $SF_6$, or other fluorine containing compounds. When the deposits formed in the chamber from conducting a plasma trench etch on a previous substrate, the preferred cleaning gas is $SF_6$.

This process is an example of a process that removes the compatible layer (i.e. silicon nitride layer 906) and the deposits formed from processing a previous substrate (i.e., the deep trench etch conducted on the previous substrate). Referring to FIG. 2, a plasma 230 is energized from the etchant and cleaning gas mixture using generators 218, 222 by inductively coupling energy into the chamber 210. For example, the plasma can be formed by applying an RF source current to the inductor antenna 212 encircling the chamber 210, and applying an RF bias voltage to the cathode pedestal 216. The gases ionize in the applied electric field to form ions and neutrals that etch the layer on the substrate 203 and the residue to form volatile gaseous species that are exhausted from the chamber 210. The process is conducted at a chamber pressure of 10 mT, pedestal temperature of 15° C., a backside cooling pressure of 8 T, a source power of 1200 W, a bias power of 100 W. The plasma is formed from a gas mixture that includes a fluorine containing compound and a bromine containing compound. One representative gas mixture includes 140 sccm HBr and 10 sccm $SF_6$. This process removes the 2,200 Å of silicon nitride 906 in stack 900 and the residue from the previous substrate etch process in about 70 seconds. Thus, the plasma etch chemistry and the sequence of processing the DRAM layers have been advantageously selected so that a single step removes next layer of material to be etched from the stack while also removing the residue from the previous substrate. Moreover, this step is performed in less time than the prior art dedicated chamber clean.

After processing to remove the deposits and the compatible layer, substrate 203 has a stack 900 similar to FIG. 6C which shows that the exposed portion of the compatible silicon nitride layer 906 has been removed and the underlying pad oxide layer 904 is exposed. Although described as an etchant gas for removing the layer and a cleaning gas for removing the deposits, one of ordinary skill will appreciate the complexity of the etching and cleaning processes and that the etchant gas contributes to a degree to the cleaning process and that the cleaning gas likewise contributes to the etching process.

Returning now to FIG. 7, the next step is step 715. In this step, conduct a second plasma etch process that further processes the substrate and forms deposits within the plasma etch chamber. In this step, further processing the substrate refers to removing an additional layer or layers, or removing a portion of the substrate material itself. Referring by way of example to the stack illustrated in FIGS. 6C and 6D, the thin layer of pad oxide 904 (shown exposed in FIG. 6C) may be removed and additional process steps may be conducted to form a deep trench as illustrated in FIG. 6D. Although forming trench 903 may be performed in three distinct steps (pad oxide etch or substrate open, upper trench etch and lower trench etch) as described below, the process may also be performed in a continuous cycle such that the plasma is not extinguished as the gas mixture changes between processes. Moreover, it is to be appreciated that while the deposit forming step is described as the last step (i.e., the lower trench etch) the deposit forming step could also be any or all of the other steps conducted to further process the substrate.

Referring to stack 900 in FIGS. 6C and 6D for example, the pad oxide may be removed, for example, by a suitable plasma process such as a combination of fluorine containing compound and an inert gas. One such gas combination is $CF_4$ and Ar. Other suitable fluorine containing gases include, but are not limited to: $SF_6$, F, $NF_3$, HF, $CF_3$, $CF_4$, $CH_3F$, $CHF_3$, $C_2H_2F_2$, $C_2H_4F_6$, $C_2F_6$, $C_3F_8$, $C_4F_8$, $C_2HF_5$, $C_4F_{10}$, $CF_2Cl_2$, and $CFCl_3$. Other suitable inert gases include $N_2$, He, Ne, and Xe. In a representative plasma process, the pad oxide may be etched by introducing a mixture of 40 sccm $CF_4$ and 60 sccm Ar into a chamber 220 maintained at about 30 mT with source power of 700 Watts and bias power of 50 Watts. The cathode is maintained at about 15° C. with a backside He pressure of 8 T. Using this process, an 80 Å thick layer of pad oxide formed from silicon dioxide is removed in about 20 sec.

After performing a substrate open process or pad oxide removal step, a trench etch step may be conducted. In accordance with the present invention, a residue forming process is conducted in the processing chamber and that process could be any or part of the substrate open process or trench etch process. For example, a two step trench etch process could be conducted where the first part of the trench etch utilizes a self-clean chemistry with little or no residue formation while the second of the trench etch is the residue forming process.

For example, the first step of the trench etch process could be used to etch the upper portion 910 of a deep trench 903. The upper portion of the trench 910 extends from the surface of substrate 902 (i.e. the interface between the pad oxide layer 904 and the substrate 902) down into the trench 903. Etching in the upper portion focuses on the profile angle of the top of the trench. This plasma etch could be conducted using a mixture of oxygen with a bromine containing compound. This plasma etch could be conducted where the bromine containing compound is HBr. In a specific example, the upper portion 910 of the trench 903 includes a plasma formed from a mixture of 240 sccm HBr, 35 sccm $HeO_2$ having a 7:3 $He/O_2$ ratio in a chamber with a pressure of 30 mT, substrate backside pressure of 8 T, a source power of 1800 W, a bias power of 150 W and a pedestal temperature of 15° C. In this example, the profile in the trench formed can be controlled by maintaining a constant chamber pressure, source power, HBr flow rate and pedestal temperature while changing the bias power, $HeO_2$ flow rate and backside pressure. For example, bias power could be increased to 220 Watts while $HeO_2$ flow is decreased to 32 sccm and 31 sccm and backside He pressure is increased to 12 T and 16 T.

Next, by-products formed on the bottom of the upper trench are removed with a suitable plasma process prior to commencing the lower trench process. This bottom residue removal step may be conducted by forming a plasma with a mixture of 25 sccm HBr, 10 sccm $O_2$ and 20 sccm $SF_6$ in a chamber with a source power of 1000 Watts, bias power of 200 Watts, a chamber pressure of 6 mT and backside helium pressure of 16 T. A typical bottom residue removal step last only a few seconds. Satisfactory bottom upper trench residue removal can be accomplished in about 10 seconds.

After performing the residue removal from the bottom of the upper trench portion, the lower trench process is conducted. U.S. patent application entitled "Silicon Trench Etching Using Silicon-Containing Precursors to Reduce or Avoid Mask Erosion" describes a method for etching high aspect ratio trenches in silicon where at least a portion of the silicon trench, particularly toward the bottom of the trench, is etched using a combination of reactive gases including fluorine-containing compound which does not contain silicon (FC); a silicon-containing compound (SC), which preferably also contains fluorine; and oxygen ($O_2$).

When the SC is a fluorine-containing silicon compound, the volumetric ratio of the FC to SC ranges from about 25:1 to about 1:10, and the volumetric ratio of the $O_2$ to SC ranges from about 10:1 to about 1:10. When the SC is a non-fluorine-containing silicon compound, the volumetric ratio of the FC to SC ranges from about 100:1 to about 1:10, with the volumetric ratio of the $O_2$ to SC ranges from about 10:1 to about 1:10; and, preferably the volumetric ratio of the FC to SC ranges from about 38:1 to about 1:7. The FC compound may be selected, for example, from the following: $F_2O$, $F_2O_2$, $NF_3$, NOF, $NO_2F$, $SF_6$, $SF_4$, $S_2F_2$, $S_2F_{10}$, $CF_4$, $CH_2F_2$, $CHF_3$, and $CH_3F$. The most preferred FC is $SF_6$. When the SC contains fluorine, the SC may be selected, for example, from the following: $SiF_4$, $Si_2F_6$, $SiHF_3$, $SiH_2F_2$, $SiH_3F$, $Si_2OF_6$, $SiCl_2F_2$, and $SiClF_3$. The most preferred fluorine-containing SC is $SiF_4$. When the SC does not contain fluorine, the SC may be selected from silicon-containing compounds such as $SiBr_4$, $SiHBr_3$, $SiH_2Br_2$, $SiH_3Br$, $SiCl_4$, $SiHCl_3$, $SiH_2Cl_2$, $SiH_3Cl$, $Si_2Cl_6$, $SiH_4$, $Si_2H_6$, $Si_3H_8$, $Si_4H_{10}$, $SiHI_2$, $SiH_2I$, $C_4H_{12}Si$, and $Si(C_2H_3O_2)_4$, by way of example, and not by way of limitation.

The use of a fluorine-containing silicon compound is preferred as a means of improving the etch rate and removing debris from the etched surfaces, while providing supplemental silicon availability for protection (passivation) of the etched mask sidewall and the upper etched portion of the trench 910, during etching of the bottom portion of the trench 912. The non-fluorine-containing source of silicon is preferred when the desired trench profile requires additional protection of the etched mask sidewall and the etched surface at the top of the trench during etching the bottom portion of the trench 912.

The formation of the lower trench portion 912 with increased profile control can be obtained by a plasma formed from a combination of reactive gases including fluorine-containing compound which does not contain silicon (FC); a silicon-containing compound (SC), which preferably also contains fluorine; and oxygen ($O_2$) such as a mixture of $SF_6$, HBr and $O_2$. For example, a plasma can be initiated with 26 sccm $SF_6$, 33 $SiF_4$, 65 sccm HBr, 22 $O_2$ with a 1400 W source power, a 60 W bias power, 22 mT chamber pressure, a 15° C. pedestal temperature, and a 16 T backside pressure. Excellent profile control may be obtained by decreasing the amount of $O_2$ in the plasma while maintaining the other factors constant. The two step trench process described herein with regard to step 715 of the method of the present invention provides excellent profile and results in residue formation within the processing chamber. Additionally, careful control of the volumetric ratios of the etch gases becomes increasingly important in order to maintain profile control. As such, each additional gas added to the trench etch chemistry includes a risk of diminished profile performance.

In addition to the specific process described above, other processes that further process the substrate and form deposits within the chamber may be used. For example, the co-pending and commonly assigned patent application Ser. No. 09/102,527 filed Jun. 22, 1998 entitled "Silicon Trench Etching Using Silicon-Containing Precursors to Reduce or Avoid Mask Erosion" provides several processes useful in the formation of deep silicon trenches. These processes provide various plasma chemistries useful in controlling trench profiles which may be used according to the present invention.

After conducting plasma processing operations that further process the substrate and form residues in the process chamber, remove the substrate from the processing chamber as set forth in step 720. At this point, the processed substrate (i.e. the substrate that has been processed according to steps 710 and 715) is removed from the chamber and the residues formed by processing this substrate remain in the chamber.

The next step in a method of the present invention is the decision step 725 which determines whether another wafer will be processed. If no additional wafers are to be processed or when the answer to step 725 is "No" then processing according to the method stops.

If the decision at step 725 is "Yes" process an additional wafer, then the next step is to perform step 705. According to step 705 another substrate is loaded into the processing chamber. As with the previously processed substrate, the loaded substrate will have a portion of a compatible layer exposed. The exposed compatible layer is so named because the plasma chemistry that removes the exposed layer is a process compatible with the removal of the residue produced by the deposit forming process conducted in accordance with step 715 on the previous substrate. Since no dedicated single wafer type cleaning process was conducted after step 715 was performed on the previous substrate, the residues formed during the process conducted in accordance with step 715 remain in the chamber. However, by advantageously selecting and exposing a layer of the plurality of layers formed on substrate 203 that is compatible with the residue formed in the chamber, an in-situ plasma process may be employed that will simultaneously remove both the compatible substrate layer and the deposits from the previously processed substrate.

Once the additional substrate is loaded, it is processed according to step 710 as described above. A plasma etch process is conducted in the processing chamber that removes the exposed compatible layer while also removing the residue that remained in the chamber as a result of conducting deposit forming processes on the previous substrate. After the additional substrate has been processed to remove the compatible layer and residue from the previous substrate, a plasma etch process is conducted according to step 715. In this step, a plasma etch process is conducted that further processes the substrate and forms deposits within the plasma etch chamber. After the deposit forming process step is conducted (step 715), the substrate is unloaded from the chamber as set forth in step 720. The chamber now contains the deposits formed by processing the unloaded substrate. These deposits are removed from the chamber when the next substrate having an exposed compatible layer is loaded (step 705) and processes to remove the compatible layer and the deposits (step 710). The method of the present invention continues with as set forth above until all substrates are processed.

II. Two Chamber Embodiment of the Present Invention

The throughput and process chemistry advantages of the method of the present invention may also be realized in systems having multiple processing chambers such as computer controlled processing system 400 described in greater detail below and illustrated in FIG. 4. The multiple chamber embodiment of the method of the present invention is set forth in flow chart 800 illustrated in FIG. 8. In the multiple chamber embodiment of the present invention, two chambers, for example, are coupled to a common vacuum transfer chamber such that a substrate processed in one chamber can be transferred into the other chamber without exposing the substrate to outside atmosphere. A substrate may be processed in a first chamber using a plasma etch process with a periodic cleaning cycle, or alternatively with a self-cleaning process chemistry. The process engineer has greater flexibility in the plasma etch process used in the first plasma etch chamber since the etch need only expose a compatible layer for processing in the second chamber. After processing the substrate in the first chamber to expose a compatible layer, the substrate is transferred into the second chamber where the combined compatible layer and residue removal process of the present invention (described above with respect to FIG. 7) is conducted.

Figure 8:
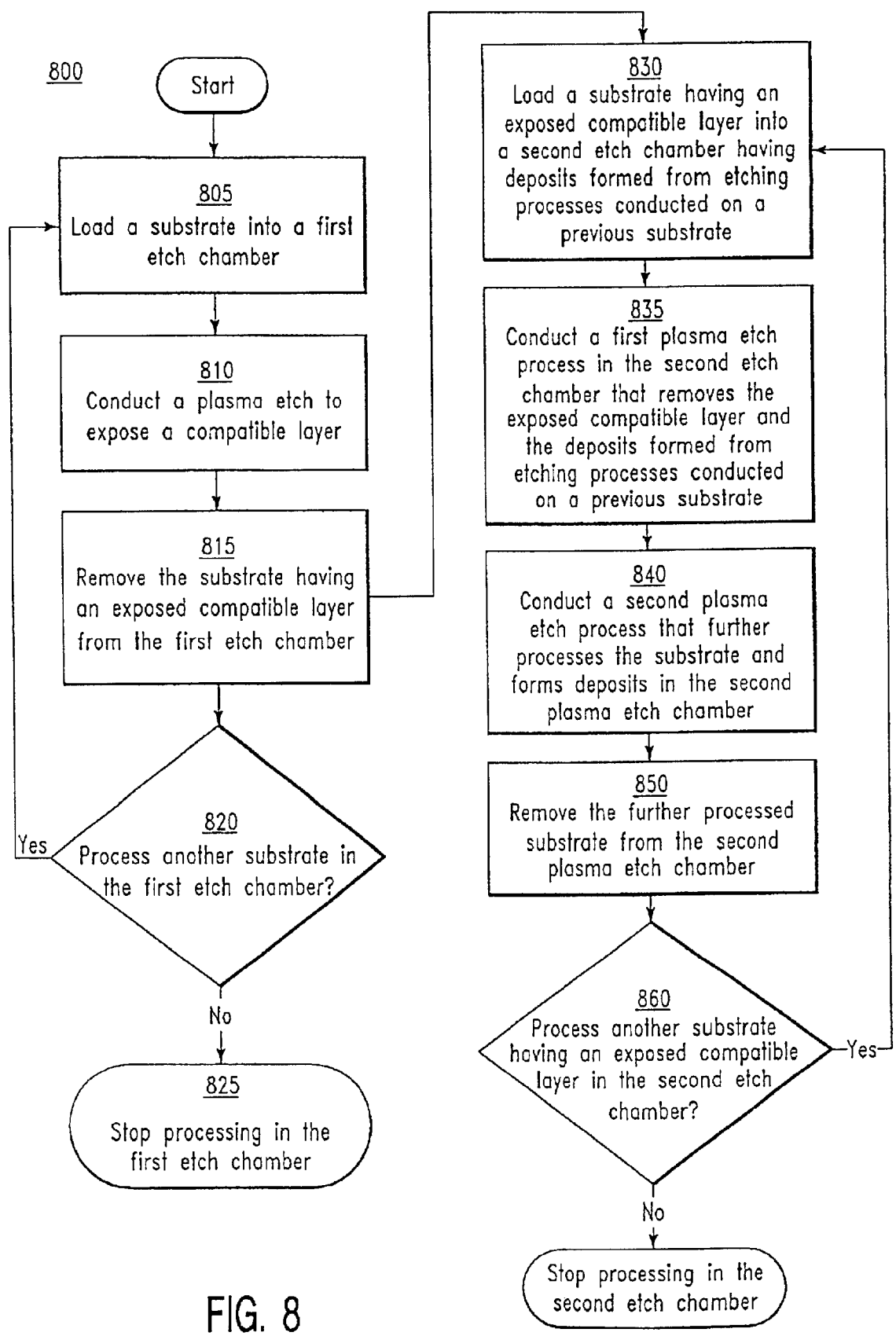
FIG. 8 is a flowchart of a two chamber method of forming silicon trenches according to the present invention.

For purposes of illustration, the multiple chamber embodiment set forth in flow chart 800 of FIG. 8 will be described with regard to the formation of deep trenches in a silicon substrate as used in the formation of 256 Mb DRAM capacitors. For illustration, FIGS. 6A, 6B, 6C and 6D illustrate a representative structure 900 formed on a substrate on which an embodiment of the method of the present is conducted. Structure 900 will be referred to in relation to the steps provided in flowchart 800. The substrate comprises, for example, a semiconductor material, such as a silicon or gallium arsenide wafer, with a plurality of layers formed thereon. The plurality of layers could be, for example, a representative DRAM structure 900 as illustrated in FIG. 6A. The DRAM structure 900 illustrated in FIG. 6A includes a silicon substrate 902 with a dielectric pad oxide layer 904, a masking layer 906 and a patterning layer 908. Typically the pad oxide layer 904 is about 80 Å thick and formed from silicon dioxide, the masking layer 906 is about 2,200 Å thick and formed from silicon nitride and the patterning layer 908 is about 7,700 Å thick and is formed from borosilicate glass (BSG) or other silicon oxide generated, for example, using tetraethyl orthosilicate (TEOS) or other suitable silicon source. For this example, a deep trench typically has a diameter of about 0.15 μm or larger and an aspect ratio as high as 35:1. In this DRAM stack, the layer compatible with the residue forming trench etch process is the silicon nitride layer. In other words, the method of the present invention will be described wherein the silicon nitride layer is the compatible layer.

The process will be described as implemented on a multiple chamber processing system capable of operating at least two chambers and transferring substrates between those chamber without the substrates contacting the atmosphere outside the system. One of ordinary skill will recognize that additional chamber configurations such as two chambers of one type and one of a second type; two chambers of each type or any of numerous chamber combinations may be present on the processing system implementing the present invention. Processing system 400 (shown in FIG. 4) is illustrative of one such processing chamber configuration. The first processing chamber is capable of plasma etch operations to expose a compatible layer. One such chamber is the magnetically enhanced reactive ion etch chamber like chamber 300 of FIG. 3. One of ordinary skill will realize that a wide variety of processing chambers are capable of performing plasma etch operations to expose a compatible layer and the type of chamber selected may vary depending upon the type of materials to be removed to expose the compatible layer. Any such chamber is suitable for the method of the present invention.

The second processing chamber is capable of plasma etch operations and for performing the compatible layer residue removal process of the present invention. One such chamber is the high density plasma chamber 200 of FIG. 2. One of ordinary skill will realize that a wide variety of processing chambers are capable of performing plasma etch operations for the compatible layer residue removal process of the present invention and that the chamber selected will vary according to the residue forming process and compatible layer selected. The description which follows includes an embodiment of the present invention with a MERIE chamber 300, a HDP etch chamber 200, a DRAM stack 900, a high aspect ratio deep trench as the residue forming process and a layer of silicon nitride as a compatible layer. This embodiment is provided for purposes of illustration and is not intended to limit the invention.

The first step according to step 805 of flow chart 800 is to load a substrate into a first etch chamber. The substrate may have a plurality of layers formed thereon. One of the plurality of layers is a layer compatible with the residue forming process that is conducted in the second chamber. In this example, the substrate includes a number of layers such as structure 900 of FIG. 6A. The first etch chamber could be the magnetically enhanced reactive ion etch chamber described above or other etch chamber capable of conducting processing operations to expose the compatible layer.

Next, according to step 810, conduct a plasma etch to expose a compatible layer. In this step, a portion of the substrate or layers formed on the substrate are removed to expose a compatible layer. The compatible layer is the layer to be removed during processing in the second etch chamber while conducting the compatible layer —residue removal process of the present invention (i.e. step 835). For example, when the substrate loaded into the first processing chamber has the DRAM structure 900 described above and the residue forming process in the second chamber is a trench etch process, the silicon nitride layer 906 is the compatible layer. According to this step of the present invention, portions of the oxide layer 908 must be removed to expose the compatible silicon nitride layer 906. After conducting this process, a portion of patterning layer 908 is removed to expose masking layer 906 as illustrated in FIG. 6B.

Although this example illustrates the removal of a single layer to expose a compatible layer, one of ordinary skill will recognize that the method of the present invention could be implemented to remove several layers in order to expose a compatible layer.

One process capable of exposing the silicon nitride compatible layer of structure 900 is a plasma formed from a mixture of 100 sccm $CHF_3$ and 20 sccm $O_2$. The process of removing the oxide layer to expose the compatible nitride layer could be conducted with a magnetic power of 30 Gauss, and RF power of 500 Watts and a cathode temperature of about 50° C. This process has an etch rate of about 1 µm/minute. Thus, the 7000 Å patterning layer illustrated would be etched in about 42 seconds. Such a process may be conducted utilizing a periodic clean where the chamber is cleaned only after processing a number of wafers. Additionally, the compatible layer exposure etch process may also utilize self-cleaning chemistry where a cleaning gas and an etchant gas are injected together such that as layers are removed from the substrate and deposits are removed from the chamber simultaneously.

Next, according to step 815, remove the substrate having an exposed compatible layer from the first etch chamber. Once the process of exposing the compatible layer is complete, the substrate is removed and sent to the second process chamber for processing according to step 830 or stored within the processing system, as in loadlocks 405 or 407 (FIG. 4), for later processing.

Next, according to step 820, is to determine whether to process another substrate in the first processing chamber. Factors determining whether to process another substrate are: do additional substrates remain for processing, and, in the case of a periodic clean reactor, the number of substrates processed since the last cleaning cycle. If more substrates are to be processed and a self-cleaning process is being used to expose the compatible layer, then the next step for the first processing chamber is to load another substrate according to step 805. If a periodic cleaning cycle is being used in conjunction with the compatible layer exposing process and a periodic clean is not yet required, then the next step for the first processing chamber is to load another substrate according to step 805.

Processing in the first processing chamber is complete when all substrates to be processed using the compatible layer exposure etching process are processed. Alternatively, processing in the first processing chamber may cease when the chamber is taken out of service for cleaning. For example, the chamber may be shut down for a periodic cleaning because a periodic cleaning cycle is employed or because residues not removed during the self-clean process must be removed. The first etch chamber operates independently of the second etch chamber to provide substrates having exposed compatible layers.

The next step of this embodiment of the method of the present invention is set forth in step 830 of flow chart 800. According to this step, load a substrate having an exposed compatible layer into a second etch chamber having deposits formed therein from a previously processed substrate. In this step, a substrate processed in the first etch chamber to expose a compatible layer is loaded into the second etch chamber. The second etch chamber has deposits formed therein. In other words, the second etch chamber is considered dirty since it contains the residue or deposits formed from the previously processed substrate. The layer exposed to processing in the second etch chamber is referred to as compatible since the process chemistry used to remove the compatible layer also removes or is compatible with the removal of the deposits formed from the previously processed substrate.

In the example of the DRAM stack (structure 900) and the high aspect ratio trench etch, the exposed compatible layer is the silicon nitride layer. The residue in the second process chamber when the substrate was loaded was a by-product of the deep trench etch process conducted on the previous substrate. The substrate having an exposed compatible layer as part of structure 900 is illustrated in FIG. 6B.

Next, as set forth in step 835, conduct a first plasma etch process in the second etch chamber that removes a portion of the exposed compatible layer and cleans the deposits formed from etching processes conducted on a previously processed substrate. This step improves processing efficiency because a single step further processes the wafer (i.e. removes a portion of the compatible layer) and cleans the chamber (i.e. removes the deposits from the trench etch process of the previous substrate). Using the method of the present invention, therefore, removes the clean after each wafer normally required after a trench etch while not requiring the trench etch to include self-clean gas chemistry.

The gas composition of the first plasma etching operation includes a gas mixture capable of removing both the compatible layer and the residue. While a single gas may be used, a typical process gas mixture for the first plasma etch operation includes an etchant gas for etching the compatible layer of the substrate and a cleaning gas for removing the residue from the previous substrate processing. Suitable etchant gases for etching the compatible layer will vary depending on the type of compatible layer presented. Suitable cleaning gases will vary depending upon the type of residue formed. Applicants have found that for the silicon trench residue, silicon nitride layer combination of the representative DRAM structure 900, one suitable gas combination for the first plasma etching operation includes a fluorine containing compound and a bromine containing compound. Suitable sources for bromine containing compound include, but are not limited to: HBr, $Br_2$, $CFBr_3$. Suitable sources for a fluorine containing compound include, but are not limited to: $SF_6$, F, $NF_3$, HF, $CF_3$, $CF_4$, $CH_3F$, $CHF_3$, $C_2H_2F_2$, $C_2H_4F_6$, $C_2F_6$, $C_3F_8$, $C_4F_8$, $C_2HF_5$, $C_4F_{10}$, $CF_2Cl_2$, and $CFCl_3$. In a specific embodiment, the fluorine containing compound is SF6 and the bromine containing compound is HBr.

A process gas mixture comprising etchant gas for etching the compatible layer of the substrate and a cleaning gas for removing the residue from the previous substrate processing is introduced into the chamber 200 through the gas outlet 226. The chamber is typically maintained at a pressure ranging from about 0.1 to about 400 mTorr. In the case where the compatible layer is formed from silicon nitride the preferred etchant gas is HBr. Suitable cleaning gases for removing the residue from the process chamber include, for example, $NF_3$, $CF_4$, $SF_6$, or fluorine containing compounds. When the deposits were formed in the chamber by conducting a plasma trench etch on a previous substrate, the preferred cleaning gas is $SF_6$.

This process is an example of a process that removes the compatible layer (i.e. silicon nitride layer 906) and the deposits. Referring to FIG. 2, a plasma 230 is energized from the etchant and cleaning gas mixture using generators 218, 222 by inductively coupling energy into the chamber 210. For example, the plasma can be formed by applying an RF source current to the inductor antenna 212 encircling the chamber 210, and applying an RF bias voltage to the cathode pedestal 216. The gases ionize in the applied electric field to form ions and neutrals that etch the layer on the substrate 203 and the residue to form volatile gaseous species that are exhausted from the chamber 210. The process is conducted at a chamber pressure of 10 mT, pedestal temperature of 15° C., a backside cooling pressure of 8 T, a source power of 1200 W, a bias power of 100 W. The plasma is formed from a gas mixture that includes a fluorine containing compound and a bromine containing compound. One representative gas mixture includes 140 sccm HBr and 10 sccm $SF_6$. Thus, the plasma etch chemistry and the sequence of processing the DRAM layers have been advantageously selected so that a single step removes next layer of material to be etched from the stack while also removing the residue from the previous substrate.

After processing to remove the deposits and the compatible layer, substrate 203 has a stack 900 similar to FIG. 6C which shows the exposed portion of the compatible silicon nitride layer has been removed and the underlying pad oxide layer 904 is exposed. Although described as an etchant gas for removing the layer and a cleaning gas for removing the deposits, one of ordinary skill will appreciate the complexity of the etching and cleaning processes and that the etchant gas contributes to a degree to the cleaning process and that the cleaning gas likewise contributes to the etching process.

Returning now to FIG. 8, the next step is step 840. In this step, conduct a second plasma etch process that further processes the substrate and forms deposits within the second plasma etch chamber. In this step, further processing the substrate refers to removing an additional layer or layers, or removing a portion of the substrate material itself. Referring by way of example to the structure 900 illustrated in FIGS. 6C and 6D, the thin layer of pad oxide (shown exposed in FIG. 6C) may be removed and additional process steps may be conducted to form a deep trench as illustrated in FIG. 6D. Although forming trench 903 may be performed in three distinct steps (pad oxide etch or substrate open, upper trench etch and lower trench etch) as described below, the process may also be performed in a continuous cycle such that the plasma is not extinguished as the gas mixture changes between processes. Moreover, it is to be appreciated that while the deposit forming step is described as the last step (i.e., the lower trench etch) the deposit forming step could also be any or all of the other steps conducted to further process the substrate. Referring to stack 900 in FIGS. 6C and 6D for example, the pad oxide may be removed, for example, by a suitable plasma process such as a combination of fluorine containing compound and an inert gas. One such gas combination is $CF_4$ and Ar. Other suitable fluorine containing gases include, but are not limited to: $SF_6$, F, $NF_3$, HF, $CF_3$, $CF_4$, $CH_3F$, $CHF_3$, $C_2H_2F_2$, $C_2H_4F_6$, $C_2F_6$, $C_3F_8$, $C_4F_8$, $C_2HF_5$, $C_4F_{10}$, $CF_2Cl_2$, and $CFCl_3$. Other suitable inert gases include $N_2$, He, Ne and Xe. In a representative plasma process, the pad oxide may be etched by introducing a mixture of 40 sccm $CF_4$ and 60 sccm Ar into a chamber 220 maintained at about 30 mT with source power of 700 Watts and bias power of 50 Watts. The cathode is maintained at about 15° C. with a backside He pressure of 8 T. Using this process, an 80 Å thick layer of pad oxide formed from silicon dioxide is removed in about 20 sec.

After performing a substrate open process or pad oxide removal step, a trench etch step may be conducted. In accordance with the present invention, a residue forming process is conducted in the processing chamber and that process could be any or part of the substrate open process or trench etch process. For example, a two step trench etch process could be conducted where the first part of the trench etch utilizes a self-clean chemistry with little or no residue formation while the second of the trench etch is the residue forming process.

For example, the first step of the trench etch process could be used to etch the upper portion 910 of a deep trench 903. This plasma etch could be conducted using a mixture of oxygen with a bromine containing compound. This plasma etch could be conducted where the bromine containing compound is HBr. In a specific example, the upper portion 910 of the trench 903 includes a plasma formed from a mixture of 240 sccm HBr, 35 sccm $HeO_2$ having a 7:3 $He/O_2$ ratio in a chamber with a pressure of 30 mT, substrate backside pressure of 8 T, a source power of 1800 W, a bias power of 150 W and a pedestal temperature of 15° C. In this example, the profile in the trench formed can be controlled by maintaining a constant chamber pressure, source power, HBr flow rate and pedestal temperature while changing the bias power, $HeO_2$ flow rate and backside pressure. For example, bias power could be increased to 220 Watts while $HeO_2$ flow is decreased to 32 sccm and 31 sccm and backside He pressure is increased to 12 T and 16 T.

Next, by-products formed on the bottom of the upper trench are removed with a suitable plasma process prior to commencing the lower trench process. This bottom residue removal step may be conducted by forming a plasma with a mixture of 25 sccm HBr, 10 sccm $O_2$ and 20 sccm $SF_6$ in a chamber with a source power of 1000 Watts, bias power of 200 Watts, a chamber pressure of 6 mT and backside helium pressure of 16 T. A typical bottom residue removal step last only a few seconds. Satisfactory bottom upper trench residue removal can be accomplished in about 10 seconds.

After performing the residue removal from the bottom of the upper trench portion, the lower trench process is conducted. U.S. patent application entitled "Silicon Trench Etching Using Silicon-Containing Precursors to Reduce or Avoid Mask Erosion" describes a method for etching high aspect ratio trenches in silicon where at least a portion of the silicon trench, particularly toward the bottom of the trench, is etched using a combination of reactive gases including fluorine-containing compound which does not contain silicon (FC); a silicon-containing compound (SC), which preferably also contains fluorine; and oxygen ($O_2$).

When the SC is a fluorine-containing silicon compound, the volumetric ratio of the FC to SC ranges from about 25:1 to about 1:10, and the volumetric ratio of the $O_2$ to SC ranges from about 10:1 to about 1:10. When the SC is a non-fluorine-containing silicon compound, the volumetric ratio of the FC to SC ranges from about 100:1 to about 1:10, with the volumetric ratio of the $O_2$ to SC ranges from about 10:1 to about 1:10; and, preferably the volumetric ratio of the FC to SC ranges from about 38:1 to about 1:7. The FC compound may be selected, for example, from the following: $F_2O$, $F_2O_2$, $NF_3$, $NOF$, $NO_2F$, $SF_6$, $SF_4$, $S_2F_2$, $S_2F_{10}$, $CF_4$, $CH_2F_2$, $CHF_3$, and $CH_3F$. The most preferred FC is $SF_6$. When the SC contains fluorine, the SC may be selected, for example, from the following: $SiF_4$, $Si_2F_6$, $SiHF_3$, $SiH_2F_2$, $SiH_3F$, $Si_2OF_6$, $SiCl_2F_2$, and $SiClF_3$. The most preferred fluorine-containing SC is $SiF_4$. When the SC does not contain fluorine, the SC may be selected from silicon-containing compounds such as $SiBr_4$, $SiHBr_3$, $SiH_2Br_2$, $SiH_3Br$, $SiCl_4$, $SiHCl_3$, $SiH_2Cl_2$, $SiH_3C$, $Si_2Cl_6$, $SiH_4$, $Si_2H_6$, $Si_3H_8$, $Si_4H_{10}$, $SiHI_2$, $SiH_2I$, $C_4H_{12}Si$, and $Si(C_2H_3O_2)_4$, by way of example, and not by way of limitation.

The use of a fluorine-containing silicon compound is preferred as a means of improving the etch rate and removing debris from the etched surfaces, while providing supplemental silicon availability for protection (passivation) of the etched mask sidewall and the upper etched portion of the trench, during etching of the bottom portion of the trench. The non-fluorine-containing source of silicon is preferred when the desired trench profile requires additional protection of the etched mask sidewall and the etched surface at the top of the trench during etching the bottom portion of the trench.

The formation of the lower trench portion with increased profile control can be obtained by a plasma formed from a combination of reactive gases including fluorine-containing compound which does not contain silicon (FC); a silicon-containing compound (SC), which preferably also contains fluorine; and oxygen ($O_2$) such as a mixture of $SF_6$, HBr and $O_2$. For example, a plasma can be initiated with 26 sccm $SF_6$, 33 $SiF_4$, 65 sccm HBr, 22 $O_2$ with a 1400 W source power, a 60 W bias power, 22 mT chamber pressure, a 15° C. pedestal temperature, and a 16 T backside pressure. Excellent profile control may be obtained by decreasing the amount of $O_2$ in the plasma while maintaining the other factors constant. The two step trench process described herein with regard to step 715 of the method of the present invention provides excellent profile and results in residue formation within the processing chamber. Additionally, careful control of the volumetric ratios of the etch gases becomes increasingly important in order to maintain profile control. As such, each additional gas added to the trench etch chemistry includes a risk of diminished profile performance.

In addition to the specific process described above, other processes that further process the substrate and form deposits within the chamber may be used. For example, the co-pending and commonly assigned patent application Ser. No. 09/102,527 filed Jun. 22, 1998 entitled "Silicon Trench Etching Using Silicon-Containing Precursors to Reduce or Avoid Mask Erosion" provides several processes useful in the formation of deep silicon trenches. These processes provide various plasma chemistries useful in controlling trench profiles which may be used according to the present invention.

After conducting plasma processing operations that further process the substrate and form residues in the process chamber, remove the substrate from the processing chamber as set forth in step 850. At this point, the processed substrate (i.e. the substrate that has been processed according to steps 835 and 840) is removed from the second plasma etch chamber while the residues formed by processing this substrate remain in the chamber.

The next step in a method of this embodiment of the present invention is the decision step 860 which determines whether another substrate having an exposed compatible layer wafer will be processed in the second plasma etch chamber. After conducting plasma processing operations that further process the substrate and form residues, remove the substrate from the processing chamber as set forth in step 850. At this point, the processed substrate (i.e. the substrate that has been processed according to steps 835 and 840) is removed from the chamber and removed from the system, sent to storage in loadlocks 415 (shown in FIG. 4) for example, sent to another chamber on the same system or to a chamber on a different system for processing.

If no additional wafers are to be processed or when the answer to step 860 is "No" then processing according to the embodied method stops.

If the decision at step 860 is "Yes" process an additional wafer, then the next step to perform is step 830. According to step 830 another substrate is loaded into the second plasma etch chamber. As with the previously processed substrate, the loaded substrate will have a portion of a compatible layer exposed. The exposed compatible layer is so named because the plasma chemistry that removes the exposed layer is a process compatible with the removal of the residue produced by the deposit forming process conducted in accordance with step 835 on the previous substrate. Since no cleaning process was conducted after step 835 was performed on the previous substrate, the residue from the process conducted in accordance with step 835 remain in the chamber. However, by advantageously exposing a layer on the substrate to be processed that is compatible with the residue formed in the chamber, an in-situ plasma process may be employed that will simultaneously remove the compatible substrate layer and the deposits from the previously processed substrate.

Once the additional substrate is loaded, it is processed according to step 830 as described above. A plasma etch process is conducted in the processing chamber that removes the exposed compatible layer while also removing the residue that remained in the chamber as a result of conducting deposit forming processes on the previous substrate. After the additional substrate has been processed to remove the compatible layer and residue from the previous substrate, a plasma etch process is conducted according to step 835. In this step, a plasma etch process is conducted that further processes the substrate and forms deposits within the plasma etch chamber. After the deposit processes step is conducted (step 835), the substrate is unloaded from the chamber as set forth in step 850. The chamber contains the deposits formed by processing the unloaded substrate. These deposits are removed from the chamber when the next substrate having an exposed compatible layer is loaded (step 830) and processes to remove the compatible layer and the deposits (step 835). The method of the present invention continues with as set forth above until all substrates are processed. The two chamber method of the present invention provides a throughput advantage in the trench etch chamber because a previously required dedicated cleaning step is now combined according with the present invention with the etching of a compatible layer. Another throughput advantage is realized by reducing the amount of material etched in the first processing chamber or the chamber which conducts a plasma etch process to expose the compatible layer according to the present invention. Previous etch sequences provided the substrate open process in one chamber and the trench etch in another chamber. Referring to the structure 900 in FIG. 6A, the substrate open process would include the removal of about 9,980 Å of material (a pad oxide of 80 Å, a masking layer of 2200 Å and a patterning layer of 7700 Å). This prior art process sequence requires about 55 seconds per wafer. The chamber would be cleaned after every 100 wafers. According to the present invention, the first process chamber need only expose the compatible layer, here the masking layer. Thus, according to the present invention, the first chamber need only etch about 7700 Å. This process can be conducted in about 42 seconds per wafer. The chamber would be cleaned after every 133 wafers. Thus, the decreased amount of material to be etched in the first chamber increases the throughput of the first chamber.

III. Exemplary High Density Plasma Etch Chamber

FIG. 2 depicts a schematic diagram of a computer controlled semiconductor wafer high density plasma (HDP) etch processing system 200 in which embodiments of the method of the present invention can be practiced. The depicted system is illustrative of an inductively coupled plasma etch system. A representative processing chamber of this type is a Silicon Etch DPS chamber available from Applied Materials, Inc. of Santa Clara, Calif. A detailed description of the DPS chamber of the kind used by Applicants was described by Yan Yee et al. at the Proceeding of the Eleventh International Symposium of Plasma Processing, May 7, 1996, and as published in the Electrochemical Society Proceedings Volume 96–12, pp. 222–223 (1996). The invention, however, is applicable to and may be practiced in any DPS, inductively coupled plasma (ICP), or other plasma based semiconductor wafer processing system. The particular embodiment of the process chamber 200 shown herein, is suitable for processing of semiconductor substrates 203, is provided only to illustrate the invention, and should not be used to limit the scope of the invention.

The schematic of the processing system in FIG. 2 shows an etching process chamber 210, which includes inductive coil antenna segment 212, positioned exterior to a dielectric, shaped ceiling 220, and connected to a radio frequency (RF) power generator 218. Additional details of the construction and operation of inductive coil 212 are described in commonly assigned U.S. patent application Ser. No. 08/648,254, which is incorporated herein by reference. Power generator 218 may be a source power generator with a frequency tunable around 12.56 MHz for impedance matching at different plasma conditions, or which may be a source power generator of fixed frequency which is connected through an impedance matching network 219. Process chamber 210 also includes a substrate support pedestal (cathode) 216 which is connected to an RF frequency generator 222 (bias power generator) though an impedance matching network 224. Process chamber 210 has an inner volume 204 defined by top 220, cylindrical sidewall 230 and a bottom 213. Sidewall 230 and bottom 213 are typically made of conductive material such as aluminum or stainless steel that serve as electrical ground 234.

Figure 4:
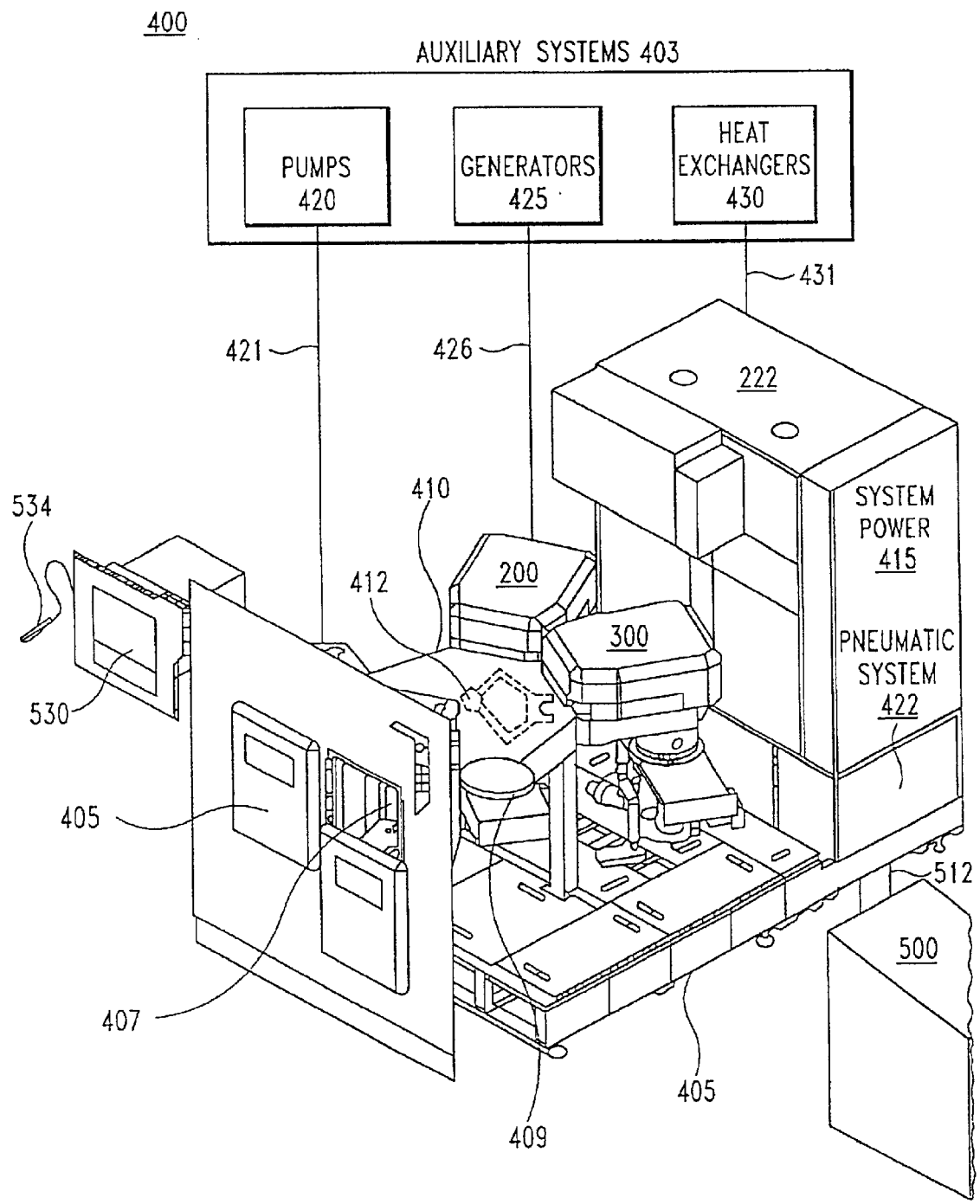
FIG. 4 is a partially schematic top view of a computer controlled semiconductor processing system.

A semiconductor substrate 203 is placed on support pedestal 216 via a robot (not shown) from transfer chamber 410 (transfer chamber 410 is shown in FIG. 4). The substrate can be held in place during processing using mechanical clamping means or an electrostatic chuck. When open, slit valve 214 provides access into chamber volume 204 from transfer chamber 410. When closed, slit valve 214 provides a pressure seal between chamber 210 and transfer chamber 410. A robot (not shown) and a lift and positioning mechanism 250 transfer and place, respectively, a semiconductor substrate, which may contain partially formed integrated circuits, on support pedestal 216. Gaseous components from gas panel 222 are fed into processing region 204 via gas control valve or valves 225 to gas inlets 226. Only a single line and valve are shown for clarity.

In a process, such as an etch process, the plasma 230 is formed in the chamber 210 by applying RF power to the process gas. The RF power source 218 energizes the antenna 212 to ignite and sustain a plasma 230 within the chamber 210. The pedestal 216 and thus the wafer 203 is biased by an RF signal (e.g., 400 kHz or 13.56 MHz) supplied to the pedestal by RF supply 222 and matching network 224. Those skilled in the art will realize that a plurality of steps is necessary to excite a plasma in a process chamber, i.e., supply a process gas, apply source power to the antenna, apply bias power to the pedestal and so on. One of ordinary skill in the art can perform these steps without further explanation.

The processing environment within chamber 210 is controllable. The temperature of chamber 210 is controlled by fluid circulated in conduits 254 in or around sidewall 230. If desired, lamps or other heat sources could be used to heat chamber 210. Likewise a fan (not shown) could be used to cool top 220. Pressure within volume 204 is controlled by vacuum pumps 260 and throttle valve 262. Pressure control within chamber 210 is further facilitated by a manometer or other pressure sensing device in communication with volume 204. Additional chamber sensors 232 such as endpoint detectors, safety interlocks or manometers may also be installed to further monitor or control the process conditions within chamber 210. The temperature of wafer 203 is adjusted and stabilized by controlling the temperature of pedestal 216 with either heating element 258 or by circulating temperature controlled fluid through conduit 259. A backside gas is provided from bulk gas supply 256 via valve and piping 257 to the interstitial spaces between substrate 203 and pedestal 216. The backside gas, typically an inert gas such as Helium, facilitates heat transfer between substrate 203 and pedestal 216.

A process monitor 208 monitors conditions within the process chamber 210. The process monitor can be any sensor, or combination of sensors, for measuring a condition that is dependent on the process occurring within the chamber 210. By way of example, the process monitor 208 is an Optical Emission Spectrometer (OES). The OES monitors emission of radiation from the plasma 230. Such radiation is dependent on the progress of the process occurring in the process chamber 210. Alternatively, the process monitor 208 could include an interferometer for measuring elevations such as the depth of trenches etched into a surface of the wafer 203. Such an interferometer measures the depth of the trenches by interference of light reflected from the top and bottom of the trenches. If the process monitor 208 is an OES or interferometer, radiation from within the chamber 210 is coupled to the process monitor 208 through a transparent aperture. The top 220 can be used as the aperture if it is made of a transparent material such as quartz. Alternatively a separate window can be provided in the top 220 or sidewall 230 for this purpose.

As described below in more detail with regard to FIG. 4, processing system 200 could be one of several chambers coupled to a common transfer chamber or loadlock as part of a cluster tool processing system. Access to the processing volume 204 is provided via slit valve 214 which separates chamber 200 from common transfer chamber 410. Wafer transfer robot 412, shown in phantom in FIG. 4 within transfer chamber 410, would operate cooperatively under the control of system controller 500 with lift and positioning mechanism 250 and slit valve 214 to place substrate 203 on pedestal 216.

Figure 5A:
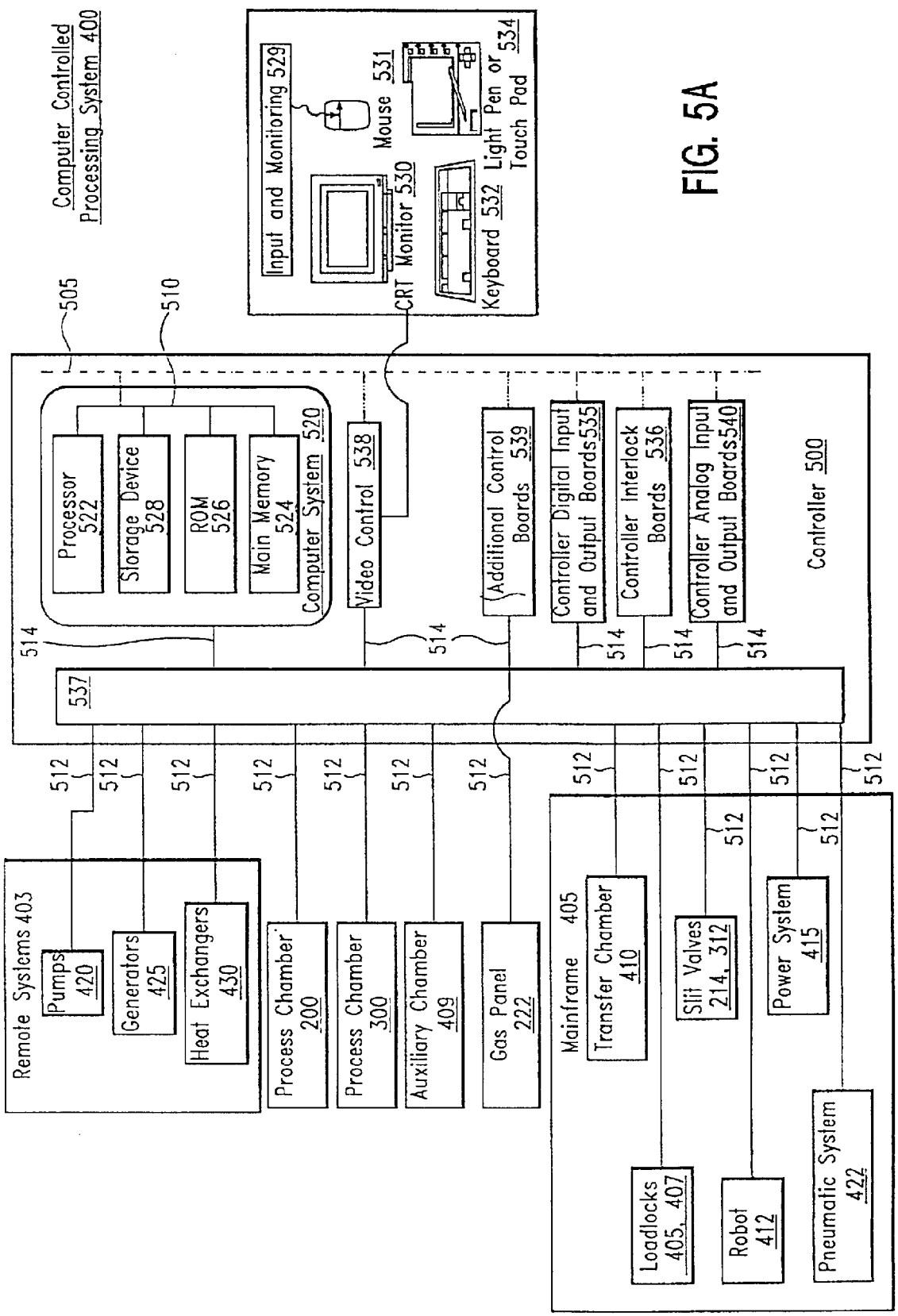
FIG. 5A is a schematic view of a computer system suitable for implementing a method of the present invention on a computer controlled processing system.
Figure 5B:
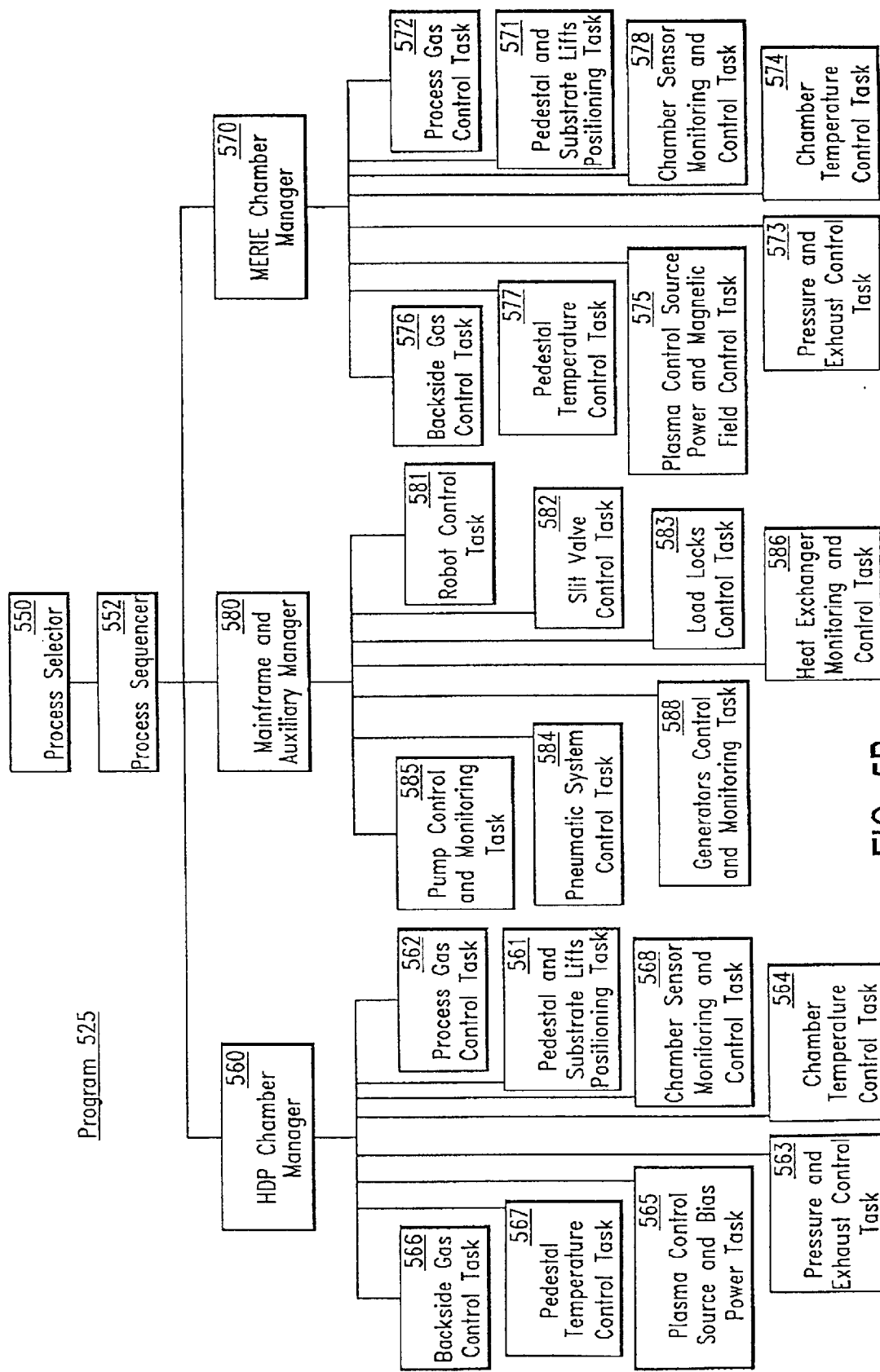
FIG. 5B is a schematic view of a computer program suitable for controlling a processing system to implement a method of the present invention.

As described in more detail with regard to controlling system 500 in FIG. 5, all the various monitoring and controlling components of chamber system 200 are controlled by computer system 520 in controller 500. All the various monitoring and controlling components of chamber system 200 are coupled via suitable signaling cable 512 to the controller 500 via backplane 537. As described in more detail in FIGS. 5A and 5B, computer system 520 communicates various signals to processing chamber 200 via controller analog, digital and interlock input and output boards 535, 536 and 540. Some components, such as gas panel 222 for example, may be connected directly to an additional control board 539. The controller 500 along with computer system 520 include hardware and software necessary to generate and monitor the signals needed to initiate, monitor, regulate, and terminate the processes occurring in process chamber 210.

IV. Exemplary Magnetically Enhanced Reactive Ion (Merie) Etch Chamber

FIG. 3 schematically illustrates a computer controlled magnetically enhanced reactive ion etch processing system chamber 300. Processing system 300 is suitable for processing semiconductor substrates 203 having partially formed integrated circuit devices formed thereon. Processing system 300 includes a chamber 310 which may be, for example, an MxP+ Oxide Etch chamber or Dielectric Etch Super e™ Centura®, both of which are commercially available from Applied Materials Inc., Santa Clara, Calif. Processing chamber 310 is schematically shown in FIG. 3, and generally described in commonly assigned U.S. Pat. No. 4,842,683 to Cheng, et al., and U.S. Pat. No. 4,668,338 to Maydan, et al., both of which are incorporated herein by reference. The description which follows describes chamber 310 coupled to a multi-chamber integrated processing system 400 which is described below in more detail with regard to FIG. 4. The particular embodiment of the processing system 300 described and shown herein is provided only to illustrate the invention, and should not be used to limit the scope of the invention.

To perform processing operations within processing system 300, the chamber 310 is evacuated using exhaust system 390 and throttle valve 395 to a pressure typically less than the pressure of transfer chamber 410. Chamber pressure within chamber 300 is maintained by exhaust system 390 in conjunction with throttle valve 395. Exhaust system 390 includes vacuum pumps that are part of pumps 420 (FIG. 4). When chamber 310 is at a suitable pressure, for example less than about 1 mTorr, slit valve 312 opens allowing a robot 412 (not shown) to transfer a substrate 203 into chamber 310. Using lift pins or other transfer mechanisms in conjunction with lift controller 360, substrate 203 is transferred from robot 412 onto support pedestal 360. Robot 412 is withdrawn and slit valve 312 closes. Support pedestal 360 also serves as a cathode electrode while the sidewalls of the chamber 310 are electrically grounded to form an anode electrode 365. The temperature of cathode 360 is controlled by heater 315 or temperature controlled fluid circulated in conduits 317. The substrate 203 an be held in place during the etching process using a mechanical clamping mechanism or an electrostatic chuck. Typically the support surface of cathode 360 is outfitted with grooves in which a coolant gas, such as helium, is held to control the temperature of the substrate. Backside cooling is provided from a bulk inert gas supply 321 containing an inert gas such as Helium and controlled by backside gas flow control valve 322.

Process gas is provided from gas panel 222 via flow and control valves 330 into the chamber 310 through a gas distributor 380 peripherally disposed about the substrate 203. An electric field is maintained in the plasma zone 355 to form a plasma from the process gas capacitively by applying an RF current to the cathode and anode electrodes 360, 365 in the process chamber 310. In reactive ion etching (RIE) processes, the plasma is typically capacitively generated by applying an RF voltage at a power level of from about 100 to about 2000 Watts to the cathode electrode 360, and by electrically grounding the anode electrode 365. Cathode electrode power supply 340 generates the R.F. signal which is coupled to cathode 360 via RF match network 345. The frequency of the RF current applied to the process electrode 360 is typically from about 50 Khz to about 60 MHz, and more typically about 13.56 MHz.

The plasma can also be enhanced using electron cyclotron resonance or magnetically enhanced reactors, in which a magnetic field generator 382 is coupled to a permanent magnet or electromagnetic coils 385 to provide a magnetic field in the plasma zone 355 to increase the density and uniformity of the plasma. Typically, the magnetic field comprises a rotating magnetic field with the axis of the field rotating parallel to the plane of the substrate 203, as described in more detail in U.S. Pat. No. 4,842,683, to Ding et al. issued Jun. 27, 1989, which is incorporated herein in its entirety by reference. As described in more detail below, controller 500 provides control signals to magnetic field power supply systems 382 to control the magnitude and direction of the currents supplied to the electromagnets 385. The associated current determines the direction and magnitude of the field generated by each coil pair.

Spent process gas and etchant by-products are exhausted from the process chamber 310 through an exhaust system 390 which includes vacuum pumps capable of achieving a minimum pressure of about $10^{-3}$ Torr in the process chamber. A throttle valve 395 is provided for controlling the pressure in the chamber 310. Process monitor 370 monitors conditions within chamber 310. The process monitor can be any sensor or combination of sensors for measuring a condition that is dependent on the processing within the chamber 310. Process monitor 370 could be, for example, an optical endpoint detector used to determine completion of the etching process for a specific layer by measuring the change in light emission of a particular wavelength corresponding to a detectable gaseous species. A sudden decrease or increase in the amount of the detectable species that results from chemical reaction of the process gas with the layer indicates completion of etching of that layer and the beginning of etching of another layer. These changes are detected by the monitor 370, transmitted to controller 500 and utilized by computer system 520 to end a process or change a process step.

In addition to controlling application of current to the electromagnets 385 and magnetic field generators 382, controller 500 controls the gas flow from gas panel 222, application of RF power from cathode power supply 340, flow of cooling gas from supply 321, cathode temperature control via cooling conduits 317 or heater 315, vacuum and exhaust system 390 (including throttle valve 395), positions of cathode and wafer lift 360, slit valve 312, and the fluid flow within chamber cooling system 362. Control signals generated by computer system 520 in response to processing and sequencing recipes or programs are communicated from digital, analog, and interlock input/output boards 535, 536, 540 to the various components of processing system 300 via signaling cables 512. In some cases, components in processing system 300 may be connected directly to a control board instead of via controller backplane 537. For example, gas panel 222 may be connected via signaling cables 512 directly to additional control board 539.

V. Exemplary Multi-Chamber Integrated Processing System

FIG. 4 illustrates a computer controlled, integrated, modular, multiple chamber, vacuum processing system 400 of the type described in U.S. Pat. No. 4,951,601 to Maydan et al. with a dual loadlock of the type described in U.S. Pat. No. 5,186,594 to Toshima et al., both of which are incorporated herein by reference. Computer controlled processing system 400 includes a mainframe 405, system controller 500 and auxiliary systems 403. Mainframe 405 is the support structure for central transfer chamber 410, processing chambers 200, 300, auxiliary chamber 409 and loadlocks 407 and 405. Mainframe 405 also supports gas panel 222, system power panel 415 and pneumatic supply system 422. Common transfer chamber 410 which includes a wafer exchange robot 412 (shown in phantom) adapted to move wafers between loadlocks 405 and 407 and the processing and auxiliary chambers 200, 300 and 409. Processing system 400, for example, could be a Centura™ processing system as is commercially available from Applied Materials, Inc. of Santa Clara, Calif.

Dual loadlocks 405 and 407 receive substrates for processing in processing system 400. Each loadlock operates independent of the other which means that while one loadlock is under vacuum and in communication with is central transfer chamber 410, the other loadlock may be open to atmosphere and receiving additional substrates for processing. Processing 200,300 and auxiliary 409 chambers coupled to central transfer chamber 410 are suitable for sequentially and simultaneously performing different process steps such as deposition, etching, physical sputtering, rapid thermal anneal and chemical mechanical polishing of dielectric, semiconductor and conductor layers on workpieces such as, for example, semiconductor wafers. Processing system 400 can be configured with different processing chambers to perform a combination of different processing steps or with a number of similar processing chambers which each perform the same processing operation. FIG. 4 illustrates a processing system 400 having an HDP etch chamber 200 and an MERIE processing chamber 300 each of which is configured to conduct embodiments of the method of the present invention.

Gas panel 222 includes valves and flow controllers (not shown) which are coupled to loadlocks 405 and 407, central transfer chamber 410 and auxiliary 409 and process chambers 200, 300. Typically an inert gas, such as nitrogen, is employed to purge loadlocks 405 and 407 and central transfer chamber 410. Process gases including inert gases are provided to auxiliary and processing chambers 409, 200 and 300. Gases are provided to the various chambers under the control of computer controller 500.

Auxiliary systems 403 includes such equipment as vacuum pumps 420, generators 425 and heat exchangers 430. Additional equipment, such as ozone generators and exhaust treatment systems for example, may also be provided depending upon the specific application of processing system 400.

Pumps 420 typically include pumps of varying capacity to facilitate controlled pressure environments within process, auxiliary and transfer chambers and loadlocks of processing system 400. Pumps 420 operate under the control of system controlled 500. Pumping connection 421 is illustrated as a single line for clarity and is intended to represent suitable piping, wiring, and pneumatic connections between pumps 420 and the various components of mainframe 405.

Heat Exchangers 430 provide temperature controlled fluids under the control of system controller 500 for heating and cooling various components such as process chamber walls and substrate lift pedestals. Heat exchanger connection 431 is illustrated as a single line for clarity and is intended to represent suitable wiring and piping to couple heat exchangers 430 to the various components of mainframe 405.

Generators 425 include the RF power sources and other types of power sources needed to perform processing operations in processing system 400. Generator connection 426 is illustrated as a single line for clarity and is intended to represent suitable wiring and other components to couple the energy generated by generators 425 to the appropriate component on mainframe 405.

Typically, processing system 400 operates in a strictly controlled, high purity environment within a wafer fabrication facility or fab. The area surrounding loadlocks 405 and 407 is usually the most strictly controlled since substrates may be exposed to the fab atmosphere while being loaded into loadlocks 405 and 407. Given the high cost of maintaining such a high purity environment, processing system 400 is typically positioned within the fab to minimize the amount of clean room space needed. For example, loadlocks 405 and 407 would be in communication with the environment having the highest purity while a wall or other partition would separate the remainder of mainframe 405 from the high purity environment. Additionally, auxiliary systems 403 may be located remote to mainframe 405 to further reduce the amount of clean room space occupied by processing system 400. FIG. 4 represents such a remote placement of auxiliary systems 403. It is to be appreciated that occasionally some auxiliary system components, such as generators 425 for example, may be positioned on mainframe 405 adjacent to their respective chambers.

System controller 500, described in more detail below with regard to FIG. 5, monitors and directs all the functions of processing system 400. The controlling functions of system controller 500 include but are not limited to monitoring all process parameters and system activities, controlling digital and analog signals, directing wafer transfers, program process recipes, and wafer sequences, controlling video and system interfaces within processing and auxiliary chambers, mainframe and auxiliary systems. Controller 500 communicated with processing system components via appropriate signaling cables 512. Controller 500 can be modified to perform other controlling functions as additional or different processing or auxiliary chambers or metrology equipment are added to processing system 400.

In operation, a user loads a cassette of substrates into loadlocks 405 and 407. Using CRT 530 and light pen 534 or other input device, the user inputs a processing sequence into the memory of controller 500 or activates a processing sequence stored in the memory of controller 500. A processing sequence typically involves pumping at least one of the loadlocks 405 and 407 and the central transfer chamber 410 to reduced pressure. According to the processing sequence, the robot 412 within central transfer chamber 410 sequences substrates from the cassettes inside loadlocks 405 and 407 to processing 200, 300 or auxiliary chambers 409. Once inside a processing or auxiliary chamber, a process program or recipe is executed which initiates, controls and terminates substrate processing operations within the respective processing or auxiliary chamber. After processing is completed, the processed substrate may be transferred to the loadlock or to another chamber for additional processing. One advantage of central transfer chamber 410 and loadlocks 405,407 is that substrates may be repeatedly processed in one chamber by sequencing between a loadlock and a chamber or sequenced between several chambers without exposure to the fab atmosphere.

Completed substrates are transferred back into the cassettes within loadlocks 405 and 407. The loadlock with the completed cassette is vented to atmosphere and the completed cassette removed. An additional cassette is then loaded and the sequence repeats until all desired substrate processing is complete.

VI. Exemplary Computer Based Control System

The method of the present invention can be implemented in a computer controlled processing system 400 controlled by a processor based controller 500 of FIG. 5. FIG. 5 illustrates a block diagram of a system controller 500 including a programmable computer system 520, control boards 539, 535, 563, 540 and input and monitoring devices 529.

Controller 500 includes a programmable computer system 520 upon which an embodiment of the present invention may be input and implemented. Computer system 520 includes a processor 522 coupled with bus 510 or other suitable communication mechanism for communicating information between the components of computer system 520 for processing information. Computer system 520 further comprises a random access memory (RAM) or other dynamic storage device 524 (referred to as main memory), coupled to bus 510 for storing information and instructions to be executed by processor 522 such as program 525. Main memory 524 also may be used for storing temporary variables or other intermediate information during execution of instructions by processor 522. Computer system 520 also includes a read only memory (ROM) and/or other static storage device 526 coupled to bus 510 for storing static information and instructions for processor 522. A data storage device 528, such as a magnetic disk or optical disk, is coupled to bus 510 for storing information and instructions.

Computer system 520 may also be coupled via system bus 505 to input and monitoring devices 529 for communicating and receiving information from a user. Controller 500 may also include a dedicated video board, such as video control board 538, to communicate between input and monitoring devices 529 and computer system 520. A display device 530, such as a cathode ray tube (CRT), may be used for displaying information to a user. An alphanumeric input device 532, including alphanumeric and other keys, may be coupled to bus 510 for communicating information and command selections to processor 522.

Another interface between a user and processor 522 is via a CRT monitor equipped with lightpen 534. A light sensor in the tip of the lightpen detects light emitted by CRT display. To select a particular screen or function, the operator touches a designated area of the display screen and pushes the button on the pen. The touched area changes its highlighted color, or a new menu or screen is displayed, confirming communication between the lightpen and the display screen. Another type of user input device is cursor control 531, such as a mouse, a trackball, or cursor direction keys for communicating direction information and command selections to processor 522 and for controlling cursor movement on display 530. Of course, other devices, such as a keyboard, mouse, or other pointing or communication device, may be used instead of or in addition to lightpen to allow the user to communicate with processor 522. Mouse and pen based input devices as well as touch and light sensitive screens are well known in the art. Such a system may also lack a keyboard such as 532 wherein all interface is provided via the stylus as a writing instrument (like a pen) and the written text is interpreted using optical character recognition (OCR) techniques.

Controller 500 also includes control boards for sending, receiving and monitoring components of processing system 400. Controller digital input and output boards 535 are used to communicate digital signals between computer system 520 and the digitally controlled processing system components. Similarly, controller analog input and output boards 540 are used to communicate analog signals between computer system 520 and the analog controlled processing system components. Controller interlock boards 536 provide warning indications or cease operation of processing system 400 when hazardous or undesired conditions are detected. If desired, a single input and output board may be dedicated to a single component. Examples include the additional control board 539 that is dedicated to communicating with gas panel 222 and video control board 538 that is dedicated to communicating with input and monitoring devices 529.

The controller 500 components are attached to a back plane 537 via a suitable electronic connection such as an edge connector, slot connector or ribbon cable. The computer monitored and controlled components of processing system 400 are connected to controller 500 using appropriate signal cables 512. Although represented as a single line for clarity, signal cable 512 could be a single cable or multiple cables. Signal cable 512 provides for digital, analog and interlock signaling between controller 500 and the components of processing system 400. Instead of connecting via back plane 537, system components may also be connected directly to a control board in controller 500. For example, gas panel 222 could be connected directly to additional control board 539. Such connections allow additional boards and signaling capability to be added as additional components are added.

Embodiments of the method of the present invention can be implemented using a computer program 525 that is executed by processor 522. The computer program code can be written in any conventional computer readable programming language, such as 68000 assembly language, C, and Pascal. Of course a number of other suitable programming languages such as C++, Java, or Jini could be used. Suitable program code is entered into a single file, or multiple files, using a conventional text editor, and are stored or embodied in a computer usable medium, such as main memory 524. If the entered code text is in a high level language, the code is compiled, and the resultant compiler code is then linked with an object code of precompiled library routines. A bootstrap loader is used to load the compiled object code into memory. Once loaded into memory the processor reads and executes the code to perform the task identified in the program.

The mass storage device 528 stores data and instructions and retrieves data and program code instructions from a processor-readable storage medium, such as a magnetic disk or magnetic tape. For example, the mass storage device 528 can be a hard disk drive, floppy disk drive, tape drive, or optical disk drive. The storage device 528 stores and retrieves the instructions in response to directions that it receives from the processor 522. Data and program code instructions that are stored and retrieved by the storage device 528 are employed by the processor unit 522 for operating the processing system 400. The data and program code instructions are first retrieved by the storage device 528 from a medium and then transferred to the memory 524 for use by the processor 522.

FIG. 5B illustrates schematically a representative computer program 525 that includes program code to monitor and control the processing chambers, mainframe and auxiliary system components of and the movement or sequencing of substrates through computer controlled processing system 400. In one method of controlling processing on system 400, program 525 includes instructions or recipes for sequencing and processing substrates in computer controlled system 400.

Processing recipes set forth the process task performed in the chambers to accomplish the desired substrate processes. Process task are conducted concurrently within recipe steps. The duration of a process recipe step is determined by one of several methods. A process step may be performed until, for example, a predetermined time period has elapsed; a process condition is satisfied such as a predetermined pressure is reached; or a sensor registers step terminating variable such as when an endpoint detector registers a particular wavelength emission. The process recipe, or program 525, includes predetermined sets of process parameters necessary to carry out specified processes, and are identified by predefined set numbers. The process selector 550 identifies (i) the desired process chamber, and (ii) the desired set of process parameters needed to operate the process chamber for performing the desired process.

The process parameters included in the recipe perform a specific process relate to process task such as, in a computer controlled HDP etch chamber 200 for example, controlling heating and cooling of pedestal 216 with pedestal temperature control task 567, gas panel composition and flow with process gas control task 562, pressure and exhaust control task 563, plasma control, source and bias power control task 565, and backside gas control task 566. The below descriptions of processing and sequencing recipes are provided merely for illustration. It is to be appreciated that numerous methods of programming the sequencing and processing of workpieces in a processing system may be implemented and that those methods will occur to those of ordinary skill in the art.

Sequencing recipes determine how substrates move from the loadlocks through the processing and auxiliary chambers of processing system 400. Sequencing recipes can be associated with individual substrates, groups of substrates or entire cassettes of substrates. Sequencing recipes employ scheduling algorithms to optimize substrate throughput, chamber utilization and minimize deadlocks. Program 525 also includes a process sequencer 552 that includes program code for accepting the identified process chamber and set of process parameters from the process selector 550, and for controlling operation of the various process chambers and mainframe components according to the process requirements. Multiple users can enter process set numbers and process chamber numbers, or a user can enter multiple process set numbers and process chamber numbers, so the sequencer 552 operates to schedule the selected processes in the desired sequence.

Preferably the sequencer 552 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer 552 takes into consideration the present condition of the process chamber being used in comparison with the desired process conditions for a selected process, or the "age" of each particular user entered request, or any other relevant factor a system programmer desires to include for determining scheduling priorities.

Program 525 is invoked by a user in response to menus or screens displayed on the CRT monitor 530. A user enters a process recipe for a particular process chamber, loads a process recipe and sequence, or program 525. The parameters specified by the process recipe can also be entered utilizing the lightpen/CRT monitor interface, for example, or via downloading a recipe from a suitable computer storage medium such as a floppy disc. Additionally, the process conditions within each chamber can be displayed on monitor 530 during processing operations.

Process selector 550 is used to indicate the desired process or processes to be conducted. Process recipes can be designated for each wafer individually or for an entire cassette of wafers. The selected process recipe provides the process selector with the desired process to be performed. Once the process sequencer 552 determines which process chamber and process set combination is going to be executed next, sequencer 552 causes execution of the process set or commands by passing the particular process set parameters or commands to a chamber managers 560 or 570 or mainframe manger 580 which control multiple tasks in process chambers 200, 300 or mainframe and remote components according to the process set determined by the sequencer 552. For example, the HDP chamber manager 560 contains program code for controlling etch operations in a HDP etch chamber 200. The chamber manager 560 also controls execution of various chamber component tasks that in turn control chamber component operations necessary to carry out the selected process set.

Examples of HDP chamber component tasks are pedestal and substrate lifts positioning task 561, process gas control task 562, pressure and exhaust system control task 563, chamber temperature control task 564, and plasma, source and bias power control task 565, backside gas control task 566 and pedestal temperature control task 567. Those having ordinary skill in the art will readily recognize that additional other chamber control tasks can be included depending on the processes to be performed in the process chamber. In operation, the HDP chamber manager 560 selectively schedules or calls the process component task in accordance with the particular process set being executed. The HDP chamber manager 560 schedules the process component task similarly to how the sequencer 552 schedules which process chamber and process set are to be executed next. Typically, the chamber manager 560 includes steps of monitoring the various chamber components and sensors; determining which components need to be operated based on the process parameters for the process set to be executed; and causing execution of a chamber component task responsive to the monitoring and determining steps.

Examples of process tasks associated with magnetically enhanced reactive ion etching (MERIE) processing chamber are: pedestal and substrate lifts positioning task 571, process gas control task 572, pressure and exhaust system control task 573, chamber temperature control task 574, and plasma, source power and magnetic field control task 575, backside gas control task 576 and pedestal temperature control task 577. Typically a MERIE chamber manager 570 includes steps of monitoring the various MERIE chamber components and sensors, determining which components need to be operated based on the process parameters for the process set to be executed; and causing execution of a chamber component task responsive to the monitoring and determining steps.

Examples of mainframe and auxiliary manager 580 tasks are: robot position control task 581, slit valve position control task 582, load locks control task 583, pneumatic system control task 584, vacuum pumps control task 585, heat exchanger control task 586, and RF generator control and monitoring task 588. Typically the mainframe and auxiliary manager 580 includes steps of monitoring the various mainframe and auxiliary components and sensors, determining which components need to be operated based on the process parameters for the process set to be executed; and causing execution of a chamber component task responsive to the monitoring and determining steps.

The coordinated operation of particular control and monitoring tasks within a program 525 will now be described. In this example, a substrate 203 is to be transferred from loadlock 407 into chamber 210, processed and returned to loadlock 407. All process tasks and sequences contained within processing program 525 (illustrated in FIG. 5B) are described with reference to a HDP chamber 200 (illustrated in FIG. 2) on an integrated processing system 400 having a computer controller 500 (illustrated in FIG. 5A). The pedestal and substrate lift positioning task 561 includes program code for controlling pedestal and substrate lift chamber components 250 that are used to load the substrate onto the pedestal 216 and to lift the pedestal 216 to a desired processing position in the chamber 210. Loadlock control task 583, in cooperation with robot control task 581 and slit valve control task 582 facilitate the movement of a substrate 203 from a storage position, for example in loadlock 407, to a transport position on robot 412. Slit valve control task 582 executes commands to open slit valve 214 as robot control task 581 executes rotation and translation commands to robot 412 to load the substrate into the chamber. When a substrate 203 is loaded into the process volume 204, lift pins or other transfer mechanisms receive the substrate 203 from robot 412. After loading the substrate, the robot control task executes commands that withdraw robot 412 from the processing chamber after which slit valve control task executes commands to close slit valve 214. The lift pins or transfer mechanisms are then lowered to place the substrate 203 on the pedestal 216, and thereafter, the pedestal 216 is raised to the desired processing position in the chamber volume 204. In operation, the pedestal and lift positioning task 561 controls movement of the pedestal and substrate lift mechanisms in response to process set parameters related to the pedestal position that are transferred from the HDP chamber manager 560.

The process gas control task 562 has program code for controlling process gas composition and flow rates for providing process gas from gas panel 222 into processing volume 204. The process gas control task 562 controls the open/close position of the shut-off valves 225, and provides control signals to mass flow controllers within gas panel 222 to obtain desired gas flow rates. The process gas control task 562 is invoked by the HDP chamber manager 560, as are all chamber component tasks, and receives from the chamber manager 560 process parameters related to the desired gas flow rates. Typically, the process gas control task 562 operates by opening the gas supply lines and repeatedly (i) reading the necessary mass flow controllers, (ii) comparing the readings to the desired flow rates received from the HDP chamber manager 560, and (iii) adjusting the flow rates of the gas supply lines as necessary. Furthermore, the process gas control task 562 includes steps for monitoring the gas flow rates for unsafe rates, and for activating the shut-off valves when an unsafe condition is detected. Alternatively, computer controlled mass flow control devices may also be incorporated so that the gas flow control task is performed by the flow control device with chamber manager 560 and controller 500 merely providing flow set points and monitoring gas flows for out of parameter conditions.

In some processes, an inert gas such as argon or nitrogen is flowed into the chamber volume 204 to stabilize the pressure in the chamber before reactive process gases are introduced into the chamber. For these processes, the process gas control task 562 is programmed to operate in coordination with pressure and exhaust control task 563 to provide steps for flowing the inert gas into the chamber volume 204 for an amount of time necessary to stabilize at the desired pressure in the chamber, and then the steps described above would be carried out. As discussed above, the desired process gas flow rates are transferred to the process gas control task 562 as process parameters. Furthermore, the process gas control task 562 includes steps for obtaining the necessary delivery gas flow rate by accessing a stored table containing the necessary values for a given process gas flow rate. Once the necessary values are obtained, the delivery gas flow rates are monitored, compared to the necessary values and adjusted accordingly.

In some chambers were a gas is introduced between the substrate 203 and the pedestal 216, as in HDP chamber 210, chamber manager 560 could include a backside gas control task 566. Backside gas control task 566 could include program code for controlling the pressure of gas provided between substrate 203 and pedestal 216 by controlling valve and flow controllers associated with backside gas supply 256. As with process gas control task 562 above, the backside gas control task 566 operates by opening the backside gas supply lines and repeatedly (i) reading the necessary mass flow controller, (ii) comparing the reading to the desired flow rate received from the HDP chamber manager 560, and (iii) adjusting the flow rate of the backside gas supply line as necessary. Furthermore, the backside gas control task 566 includes steps for monitoring the gas flow rate for unsafe rates, and for activating shut-off valves when an unsafe condition is detected. Additionally, computerized mass flow control devices could perform the backside gas control task with input and monitoring from chamber manager 560 and controller 500.

The pressure and exhaust control task 563 includes program code for controlling the pressure in the chamber volume 204 by regulating the size of the opening of the throttle valve 262 in chamber exhaust system 260 and the speed of pumps 420. The size of the opening of the throttle valve 262 is set to control the chamber pressure to the desired level in relation to the total process gas flow, size of the process chamber, and pumping setpoint pressure for the exhaust system 260. When the pressure and exhaust control task 563 is invoked, the desired, or target, pressure level is received as a parameter from the HDP chamber manager 560. The pressure and exhaust control task 563 operates to measure the pressure in the chamber volume 204 by reading one or more conventional pressure manometers connected to the chamber, compare the measured value to the target pressure, obtain PID (proportional, integral, and differential) values from a stored pressure table corresponding to the target pressure, and adjust the throttle valve 262 according to the PID values obtained from the pressure table. Alternatively, the pressure and exhaust control task 563 can be written to open or close the throttle valve 562 to a particular opening size to regulate the chamber volume 204 to the desired pressure.

The pedestal temperature control task 567 includes program code for controlling the current to heating element 258 or flow of temperature controlled fluid to conduits 259 that are used to control the temperature of pedestal 216 and substrate 203. The pedestal temperature control task 567 is also invoked by the chamber manager 560 and receives a target, or setpoint, temperature parameter. Pedestal temperature control task 567 operates cooperatively with heat exchangers control task 586 to ensure temperature controlled fluids are available and provided at a suitable temperature to obtain the set-point pedestal temperature. The pedestal temperature control task 567 measures the pedestal temperature by measuring voltage output of a thermocouple located in pedestal 216, compares the measured temperature to the setpoint temperature, and increases or decreases current applied to the heating element 258 or temperature controlled fluid to conduits 259 to obtain the setpoint temperature. The temperature is obtained from the measured thermocouple voltage, for example, by looking up the corresponding temperature in a stored conversion table, or by calculating the temperature using an appropriate mathematical calculation. Additionally, a built-in fail-safe mode can be included to detect process safety compliance, and can shut down operation of the heating and cooling elements if the process chamber 210 is not properly set up.

Chamber temperature control task 564 includes program code for controlling the flow of temperature controlled fluid from heat exchangers 430 to conduits 254 to control the temperature of chamber 210. The chamber temperature control task 564 is also invoked by the chamber manager task 560 and receives target set-point information according to user input, recipe instruction or maintenance instructions. The various temperature measurements described above with regard to pedestal temperature control task 567 can be implemented to measure and control the temperature of chamber walls 230. Chamber temperature control task 564 also operates cooperatively with heat exchangers control task 586 in order to provide temperature controlled fluids at the appropriate temperature to obtain the chamber temperature setpoint. As with pedestal temperature control task above, a fail safe mode may also be included to prevent chamber component damage should temperature control exceed safe limit values.

The plasma control task 565 comprises program code that operates in cooperation with generator control task 588 for setting source 218 and bias 222 RF power levels applied to inductive coil 212 and pedestal 216. Similar to the previously described chamber component task, the plasma control task 565 is invoked by the HDP chamber manager 560 and receives source and bias power set-points required by the processing operation being conducted in chamber 210. The plasma control task 565 monitors RF power and impedance match settings and adjusts them accordingly to provide the requested source and bias power levels. Plasma control task 565 operates cooperatively with process gas control task 562 to ensure process gases are provided to chamber volume 204 for initiating and sustaining plasma 230.

MERIE Chamber Manager 570 and Mainframe and Auxiliary Systems Manager 580, like HDP Chamber Manager 560, include program code for controlling and monitoring the various components of processing chamber system 300 of FIG. 3 and mainframe 405 and auxiliary systems 403 of FIG. 4. MERIE chamber manager 570 includes various chamber specific component control task similar to HDP chamber manager 560 described above. Additionally, MERIE chamber manager 570 includes a Plasma Control Source Power and Magnetic Field Control task 575 that includes program code to monitor and control cathode power supply 340, magnetic field generator power supply 382 and the amount of current applied to coils 385. MERIE chamber manager 570 also includes program code to monitor and control other chamber tasks such as: backside gas control task 576, pedestal temperature control task 577, pressure and exhaust control task 573, process gas control task 572, pedestal and substrate lift positioning task 571, chamber sensor monitoring and control task 576 and chamber temperature control task 574. MERIE Chamber manager 570 controls the process environment of processing chamber 300 in much the same way that HDP Chamber manger 560 controls the processing environment of processing chamber 200.

Mainframe and Auxiliary manager 580 includes program code for controlling the various components of mainframe 405 and auxiliary components 403. Mainframe and Auxiliary control manager is invoked by process sequencer 552 as are chamber managers 560 and 570. Mainframe and Auxiliary managers would include program code tailored to the specific components and parameters to be controlled. For example, robot control task 581 includes computer code for monitoring the position of robot 412 and generating rotation and extension commands based on the wafer sequencing requirements generated by process sequencer 552. Component specific monitoring and control program commands are included in slit valve control task 582. This task monitors the position of and communicates control signals for opening and closing chamber accessing valves, such as slit valves 312 and 214, that are used to separate processing chambers 200 and 300 from central transfer chamber 410. Slit valve control task 582 could also include safety control commands. These commands would, for example, prevent slit valve 214 from opening unless certain chamber pressure conditions existed in chamber 200 and transfer chamber 410 such as, for example, when both are under a prescribed pressure or when chamber 200 is at a higher pressure than transfer chamber 410.

Other monitoring and controlling task included in Mainframe and Auxiliary Control Manager task 580 are: pneumatic system control task 584, load locks monitoring and control task 583, heat exchanger monitoring and control task 586, loadlock and chamber vacuum pumps monitoring and control task 585, and RF generators monitoring and control task 588. Each of these task includes program code to monitor and control the specified component.

The above description of system controller 500, computer system 520 and monitoring and control program 525 are provided mainly for illustrative purposes. One of ordinary skill in the art will appreciate that other well known of similar controller architectures, computers, and programming codes and methodologies may be employed to monitor and control a multi-chambered integrated semiconductor fabrication system. Additionally, variations in the above described system controller such as a dedicated process control bus and redistribution of monitoring and controlling functions between mangers and task are possible.

Although the invention is described herein as being implemented in software and executed upon a general purpose computer, those skilled in the art will realize that it would be a matter of routine skill to select an appropriate computer system to control processing system 400. Those of skill in the art will also realize that the invention could be implemented using hardware such as an application specific integrated circuit (ASIC) or other hardware circuitry. Additionally, the chambers of FIGS. 2 and 3 along with the chamber and mainframe controls illustrated in FIG. 5 are merely illustrative of the types of chambers and types of chamber and mainframe controls employed. One of ordinary skill in the art will appreciate that additional controls could be added, while those illustrated could be combined or deleted if certain monitoring and control functions were not desired or provided elsewhere, without departing from the spirit of the present invention. As such, it should be understood that the invention can be implemented, in whole or in part, in software, hardware or both.

One of ordinary skill will appreciate that the method of the present invention may be embodied in a computer readable program code. This program code may be used by a computer controller, such as controller 500, for controlling a semiconductor processing system, such as processing system 400 having two processing chambers. According to the method of the present invention, one of the processing chambers may have deposits formed within it from a previously processed substrate. The program code controls the semiconductor processing system to process a wafer having a layer of material deposited thereon in the chamber in accordance with the following steps which may be conducted sequentially or nearly simultaneously,: flowing a first gaseous composition from said gas supply into said chamber; providing energy to said chamber to form a high density plasma from said first gaseous composition introduced into said chamber to remove said layer formed on said substrate and said deposits formed in said chamber from a previous substrate processing operation. Also, flowing a second gaseous composition from said gas supply into said chamber; providing energy to said chamber to form a high density plasma of said second gaseous composition to remove a portion of the substrate and form deposits in said processing chamber. After these steps have been conducted, unloading said substrate processed by said second gaseous composition; and without performing a cleaning operation to remove the deposits formed by the second gaseous composition, loading a substrate having a layer of material deposited thereon into the processing chamber.

Using the method of the present invention, processing throughputs can be increased by accomplishing in a single step the removal of residue formed while processing a previous substrate with the further processing of the present substrate. The present invention has been described with reference to certain plasma etch processes, compatible layers and processing chambers. However, other plasma etch processes that etch a compatible layer and remove previously deposited residues are possible. The process is applicable to other types of etch chambers as would be apparent to one of ordinary skill. For example, the process can be applied, as would be apparent to one of ordinary skill in the art, to treat metal etch chambers, oxide etch chambers or other chambers and substrate layers where a compatible layer is etched while also removing deposits from a previously processed substrate. Therefore, the spirit and scope of the appended claims should not be limited to the descriptions and embodiments contained herein.

We claim:

1. An apparatus for processing a semiconductor wafer in a processing chamber, said apparatus comprising:
   a gas panel coupled to said processing chamber;
   an antenna proximate to said processing chamber;
   a power supply coupled to said antenna; and
   a controller, coupled to said antenna and said gas panel, said controller containing a computer readable storage medium having program code embodied therein, said program code for controlling the apparatus in accordance with the following:
   (a) loading a substrate into a processing chamber having deposits on chamber surfaces which were generated during processing of a previous substrate;
   (b) conducting an etch process on said loaded substrate which removes at least a portion of an exposed layer present on said substrate to produce a cleaning material which simultaneously removes at least a portion of said deposits from said chamber surfaces during said etch, wherein in accordance with program code from said readable storage medium, a plasma source gas used to generate an etchant plasma is furnished to said processing chamber via said gas panel, and wherein in accordance with program code from said readable storage medium, said power supplied to generate and maintain said plasma is furnished to said processing chamber by said power supply coupled to said antenna; and
   (c) controlling said power supply in accordance with program code from said readable storage medium to provide energy to said antenna proximate to said processing chamber, thereby effecting the removal of said deposits from said chamber surfaces.

2. The apparatus of claim 1, wherein said etch process comprises plasma etching a layer of silicon nitride formed on said substrate.

3. The apparatus of claim 2, wherein said plasma source gas supplied in accordance with program code from said readable storage medium comprises a fluorine-containing compound and a bromine-containing compound.

4. The apparatus of claim 3, wherein said fluorine-containing compound is $SF_6$.

5. The apparatus of claim 3, wherein said bromine-containing compound is HBr.

6. The apparatus of claim 1, wherein said previous substrate comprises silicon, and wherein said processing of said previous substrate comprises plasma etching said silicon substrate, whereby said deposits on said chamber surfaces were generated.

7. The apparatus of claim 6, wherein plasma etching of said silicon substrate in accordance with program code from said readable storage medium is performed using a plasma source gas comprising a halogen-containing compound and oxygen.

8. The apparatus of claim 7, wherein said halogen-containing compound is HBr.

9. The apparatus of claim 6, wherein said processing of said previous substrate in accordance with program code from said readable storage medium comprises plasma etching an upper portion of a trench in said silicon substrate using a plasma source gas comprising a fluorine-containing compound and oxygen.

10. The apparatus of claim 6, wherein etching of said silicon substrate in accordance with program code from said readable storage medium is performed using a plasma source gas which includes at least three reactive gases which include at least one fluorine-containing compound which does not contain silicon, at least one silicon-containing compound, and oxygen.

11. The apparatus of claim 10, wherein a volumetric ratio of said at least one fluorine-containing compound which does not contain silicon to said at least one silicon-containing compound ranges from about 100:1 to about 1:10.

12. The apparatus of claim 9, wherein said processing of said previous substrate in accordance with program code from said readable storage medium further comprises plasma etching a lower portion of said trench in said silicon substrate using a plasma source gas which includes at least three reactive gases which include at least one fluorine-containing compound which does not contain silicon, at least one silicon-containing compound, and oxygen.

13. The apparatus of claim 10, wherein said silicon-containing compound is selected from the group consisting of $SiF_4$, $Si_2F_6$, $SiHF_3$, $SiH_2F_2$, $SiH_3F$, $Si_2OF_6$, $SiCl_2F_2$, $SiClF_3$, and combinations thereof.

14. The apparatus of claim 12, wherein said silicon-containing compound is selected from the group consisting of $SiF_4$, $Si_2F_6$, $SiHF_3$, $SiH_2F_2$, $SiH_3F$, $Si_2OF_6$, $SiCl_2F_2$, $SiClF_3$, and combinations thereof.

15. The apparatus of claim 10, wherein said silicon-containing compound does not contain fluorine and is selected from the group consisting of $SiBr_4$, $SiHBr_3$, $SiH_2Br_2$, $SiH_3Br$, $SiCl_4$, $SiHCl_3$, $SiH_2Cl_2$, $SiH_3Cl$, $Si_2Cl_6$, $SiH_4$, $Si_2H_6$, $Si_3H_8$, $Si_4H_{10}$, $SiHI_2$, $SiH_2I$, $C_4H_{12}Si$, $Si(C_2H_3O_2)_4$, and combinations thereof.

16. The apparatus of claim 12, wherein said silicon-containing compound does not contain fluorine and is selected from the group consisting of $SiBr_4$, $SiHBr_3$, $SiH_2Br_2$, $SiH_3Br$, $SiCl_4$, $SiHCl_3$, $SiH_2Cl_2$, $SiH_3Cl$, $Si_2Cl_6$, $SiH_4$, $Si_2H_6$, $Si_3H_8$, $Si_4H_{10}$, $SiHI_2$, $SiH_2I$, $C_4H_{12}Si$, $Si(C_2H_3O_2)_4$, and combinations thereof.

17. The apparatus of claim 10, wherein said fluorine-containing compound which does not contain silicon is selected from the group consisting of $F_2O$, $F_2O_2$, $NF_3$, $NOF$, $NO_2F$, $SF_6$, $SF_4$, $S_2F_2$, $S_2F_{10}$, $CF_4$, $CH_2F_2$, $CH_3F$, $CH_3F$, and combinations thereof.

18. The apparatus of claim 12, wherein said fluorine-containing compound which does not contain silicon is selected from the group consisting of $F_2O$, $F_2O_2$, $NF_3$, $NOF$, $NO_2F$, $SF_6$, $SF_4$, $S_2F_2$, $S_2F_{10}$, $CF_4$, $CH_2F_2$, $CHF_3$, $CH_3F$, and combinations thereof.

* * * * *